United States Patent
Dhir et al.

(10) Patent No.: US 10,128,183 B1
(45) Date of Patent: Nov. 13, 2018

(54) STRUCTURE OF INTEGRATED CIRCUITRY AND A METHOD OF FORMING A CONDUCTIVE VIA

(71) Applicant: Micron Technology, Inc., Boise, ID (US)

(72) Inventors: Sourabh Dhir, Boise, ID (US); Andrew L. Li, Boise, ID (US); Sanh D. Tang, Kuna, ID (US); Naoyoshi Kobayashi, Tokyo (JP); Katsumi Koge, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/926,505

(22) Filed: Mar. 20, 2018

Related U.S. Application Data

(63) Continuation of application No. 15/585,396, filed on May 3, 2017, now Pat. No. 9,960,114.

(51) Int. Cl.
*H01L 23/522* (2006.01)
*H01L 21/768* (2006.01)

(52) U.S. Cl.
CPC .... *H01L 23/5226* (2013.01); *H01L 21/76837* (2013.01); *H01L 23/5222* (2013.01)

(58) Field of Classification Search
CPC ........... H01L 23/5226; H01L 21/76837; H01L 23/5222
See application file for complete search history.

(56) References Cited

U.S. PATENT DOCUMENTS

| | | | |
|---|---|---|---|
| 8,716,116 B2 | 5/2014 | Parekh et al. | |
| 9,754,946 B1 | 9/2017 | Yang et al. | |
| 2004/0014278 A1 | 1/2004 | Lee et al. | |
| 2008/0064162 A1 | 3/2008 | Cheng et al. | |
| 2010/0285662 A1 | 11/2010 | Kim et al. | |
| 2011/0121375 A1 | 5/2011 | Kawahara et al. | |
| 2011/0266689 A1 | 11/2011 | Tang | |
| 2011/0285028 A1 | 11/2011 | Seo | |
| 2012/0199897 A1 | 8/2012 | Chang et al. | |

(Continued)

OTHER PUBLICATIONS

U.S. Appl. No. 15/489,311, filed Apr. 17, 2017, by Borsari.

*Primary Examiner* — David Vu
(74) *Attorney, Agent, or Firm* — Wells St. John P.S.

(57) ABSTRACT

A method of forming a conductive via comprises forming a structure comprising an elevationally-extending-conductive via and a conductive line electrically coupled to and crossing above the conductive via. The conductive line comprises first conductive material and the conductive via comprises second conductive material of different composition from that of the first conductive material. The conductive line and the conductive via respectively having opposing sides in a vertical cross-section. First insulator material having k no greater than 4.0 is formed laterally outward of the opposing sides of the second conductive material of the conductive via selectively relative to the first conductive material of the opposing sides of the conductive line. The first insulator material is formed to a lateral thickness of at least 40 Angstroms in the vertical cross-section. Second insulator material having k greater than 4.0 is formed laterally outward of opposing sides of the first insulator material in the vertical cross-section. Additional method aspects, including structure independent of method of fabrication, are disclosed.

20 Claims, 24 Drawing Sheets

(56) References Cited

U.S. PATENT DOCUMENTS

| | | |
|---|---|---|
| 2014/0001650 A1 | 1/2014 | Trivedi |
| 2014/0231892 A1 | 8/2014 | Song et al. |
| 2015/0061134 A1 | 3/2015 | Lee et al. |
| 2015/0262625 A1 | 9/2015 | Han et al. |
| 2016/0329343 A1 | 11/2016 | Pachamuthu et al. |

STRUCTURE OF INTEGRATED CIRCUITRY AND A METHOD OF FORMING A CONDUCTIVE VIA

RELATED PATENT DATA

This patent resulted from a continuation application of U.S. patent application Ser. No. 15/585,396, filed May 3, 2017, entitled "A Structure Of Integrated Circuitry And A Method Of Forming A Conductive Via", naming Sourabh Dhir, Andrew L. Li, Sanh D. Tang, Naoyoshi Kobayashi and Katsumi Koge as inventors, the disclosure of which are incorporated by reference.

TECHNICAL FIELD

Embodiments disclosed herein pertain to structures of integrated circuitry and to methods of forming a conductive via.

BACKGROUND

Memory is one type of integrated circuitry, and is used in computer systems for storing data. Memory may be fabricated in one or more arrays of individual memory cells. Memory cells may be written to, or read from, using digit lines (which may also be referred to as bit lines, data lines, or sense lines) and access lines (which may also be referred to as word lines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or nonvolatile. Nonvolatile memory cells can store data for extended periods of time in the absence of power. Nonvolatile memory is conventionally specified to be memory having a retention time of at least about 10 years. Volatile memory dissipates, and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

One type of memory cell has at least one transistor and at least one capacitor. In some such structures, one conductive via extends downwardly from a sense line to one source/drain region (e.g., a circuit node) of the transistor. Additionally, another conductive via may be laterally-adjacent the one conductive via and extend downwardly from a storage node of the capacitor to another source/drain region of the transistor. Unfortunately, parasitic capacitance exists laterally between the one conductive via and the other conductive via and can be 40 attofarads or more at a voltage delta between such vias of no greater than 1.1 volts. Such parasitic capacitance can adversely affect circuit performance. Parasitic capacitance laterally between conductive vias in other circuitry can also adversely affect circuit performance.

DETAILED DESCRIPTION OF EXAMPLE EMBODIMENTS

Figure 1A:
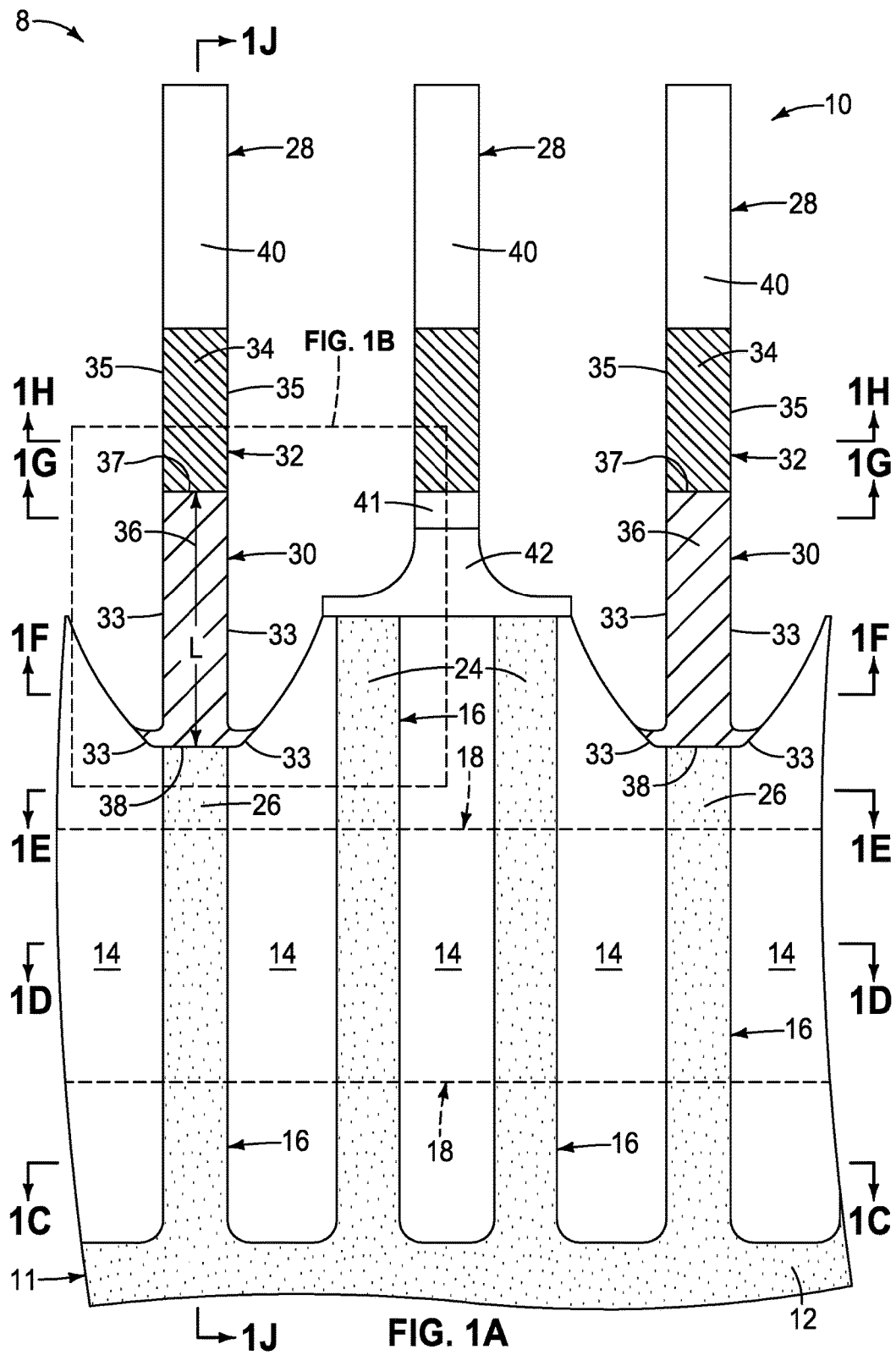
FIG. 1A is a diagrammatic sectional view of a substrate fragment in process in accordance with an embodiment of the invention, and is taken through lines 1A-1A in FIGS. 1C-1H.

Embodiments of the invention encompass methods of forming a conductive via and a structure of integrated circuitry independent of method of manufacture. Method embodiments are initially described with reference to FIGS. 1A-8H.

Referring to FIGS. 1A-1J, an example fragment of a substrate structure 8 comprises an array or array area 10 that may comprise memory cells fabricated relative to a base substrate 11. Substrate 11 may comprise any one or more of conductive/conductor/conducting (i.e., electrically herein), semiconductive/semiconductor/semiconducting, and insulative/insulator/insulating (i.e., electrically herein) materials. Various materials have been formed elevationally over base substrate 11. Materials may be aside, elevationally inward, or elevationally outward of the FIGS. 1A-1J-depicted materials. For example, other partially or wholly fabricated components of integrated circuitry may be provided somewhere above, about, or within base substrate 11. Control and/or other peripheral circuitry for operating components within a memory array may also be fabricated, and may or may not be wholly or partially within a memory array or sub-array. Further, multiple sub-arrays may also be fabricated and operated independently, in tandem, or otherwise relative one another. As used in this document, a "sub-array" may also be considered as an array.

Base substrate 11 comprises semiconductor material 12 (e.g., appropriately, and variously, doped monocrystalline silicon), trench isolation regions 14 (e.g., silicon nitride and/or doped or undoped silicon dioxide), and active area regions 16 comprising suitably-doped semiconductor material 12. In one embodiment and as will be shown, structure 8 will comprise memory cells individually comprising a field effect transistor 25 and a capacitor (not shown in FIGS. 1A-1J). However as will be apparent from the continuing discussion, fabrication of other memory cells as well as fabrication of a conductive via regardless of type of circuitry, and a structure of integrated circuitry independent of method of manufacture, are contemplated in accordance with embodiments of the invention. In the depicted example, field effect transistors 25 are shown to be in the form of recessed access devices (RADs). Such include access line constructions 18 buried in base substrate 11 and which comprise a gate insulator 20 (e.g., comprising, consisting essentially of, or consisting of silicon dioxide and/or silicon nitride) and conductive gate material 22 (e.g., comprising, consisting essentially of, or consisting of conductively-doped semiconductor material and/or metal material). Insulator material 27 (e.g., comprising, consisting essentially of, or consisting of silicon nitride and/or doped or undoped silicon dioxide) is shown above access line constructions 18. Individual field effect transistors 25 comprise a pair of source/drain regions 24, 26 laterally outward of and above access line constructions 18. When suitable voltage is applied to gate material 22 of an access line construction 18, a conductive channel can form within semiconductor material 12 proximate gate insulator 20 such that current is capable of flowing between a pair of source/drain regions 24 and 26 under the access line construction 18 within an individual active area region 16. Thus, in the example embodiment, each active area region 16 comprises two field effect transistors 25 with each sharing a central source/drain region 26.

Structures/constructions 28 have been fabricated above base substrate 11. The discussion proceeds with fabrication relative to a single structure in a method of forming a conductive via, although multiple such structures may be formed as is inherently shown in the figures. Structure 28 has been formed to comprise an elevationally-extending-conductive via 30 and a conductive line 32 electrically coupled to and crossing above conductive via 30. In one embodiment and as shown, individual conductive lines 32 are directly electrically coupled to and directly against tops 37 of conductive vias 30. Conductive line 32 comprises first conductive material 34 and conductive via 30 comprises second conductive material 36 of different composition from that of first conductive material 34. In one embodiment, first conductive material 34 comprises metal material (e.g., one or more of TiN, Ti, WN, $WSi_x$, etc.). An example thickness for conductive via 30 is 100 Angstroms to 200 Angstroms. An example thickness for conductive line 32 is 200 Angstroms to 400 Angstroms.

In one embodiment, second conductive material 36 comprises dopant(s) therein that is conductivity-increasing when within a semiconductor material (i.e., regardless of whether material 36 is a semiconductor material), and in one such embodiment source/drain region 26 comprises a circuit node comprising the semiconductor material. In one embodiment, conductive via 30 comprises conductively-doped semiconductor material that is conductively doped with the particular dopant(s). For example, and by way of example only, second conductive material 36 may comprise, consist essentially of, or consist of polysilicon that is conductively-doped with phosphorus (an n-type dopant), and material of source-drain region 26 (e.g., a circuit node) may comprise silicon that is conductively doped with phosphorus. Regardless, out-diffusion of dopant within second material 36 may occur into circuit node/source-drain region 26 inherent during substrate processing and/or be conducted by a dedicated anneal to achieve such. Alternately or additionally, and in one embodiment, second conductive material 36 may comprise metal material that may have the dopant(s) therein, and which may diffuse during processing into circuit node/source-drain region 26 (e.g., with such dopant(s) perhaps having no impact on the conductivity of second material 36 when such dopant is therein). Regardless, conductive via 30 has a bottom 38 that, in one embodiment, is directly against circuit node/source-drain region 26.

Figure 1B:
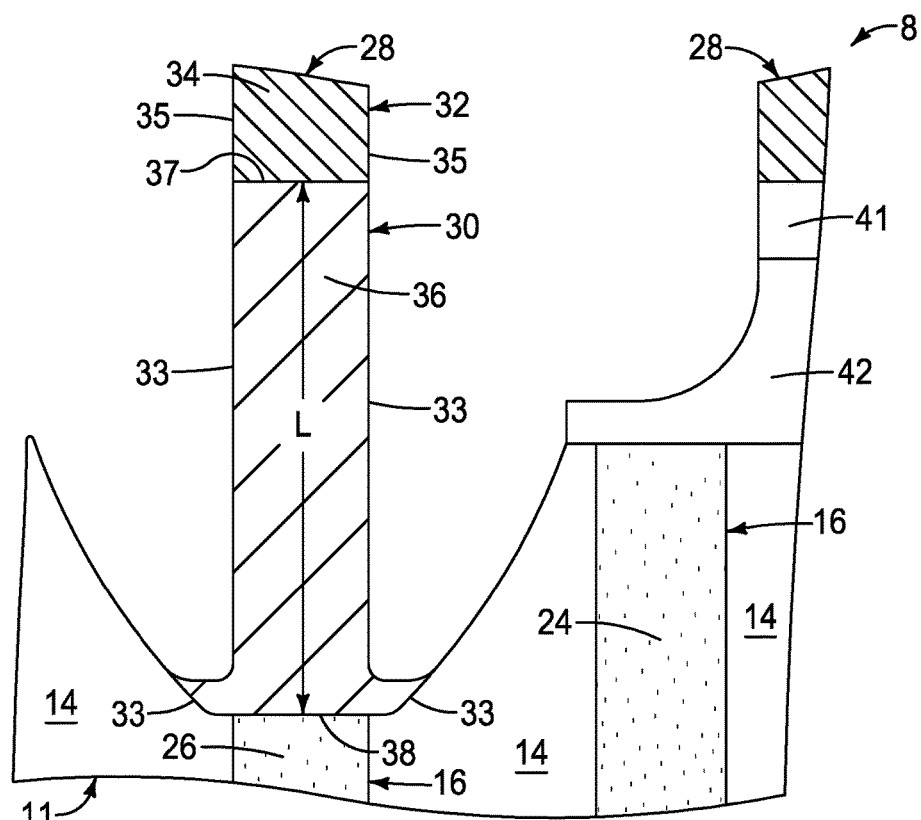
FIG. 1B is an enlarged portion of FIG. 1A.
Figure 1C:
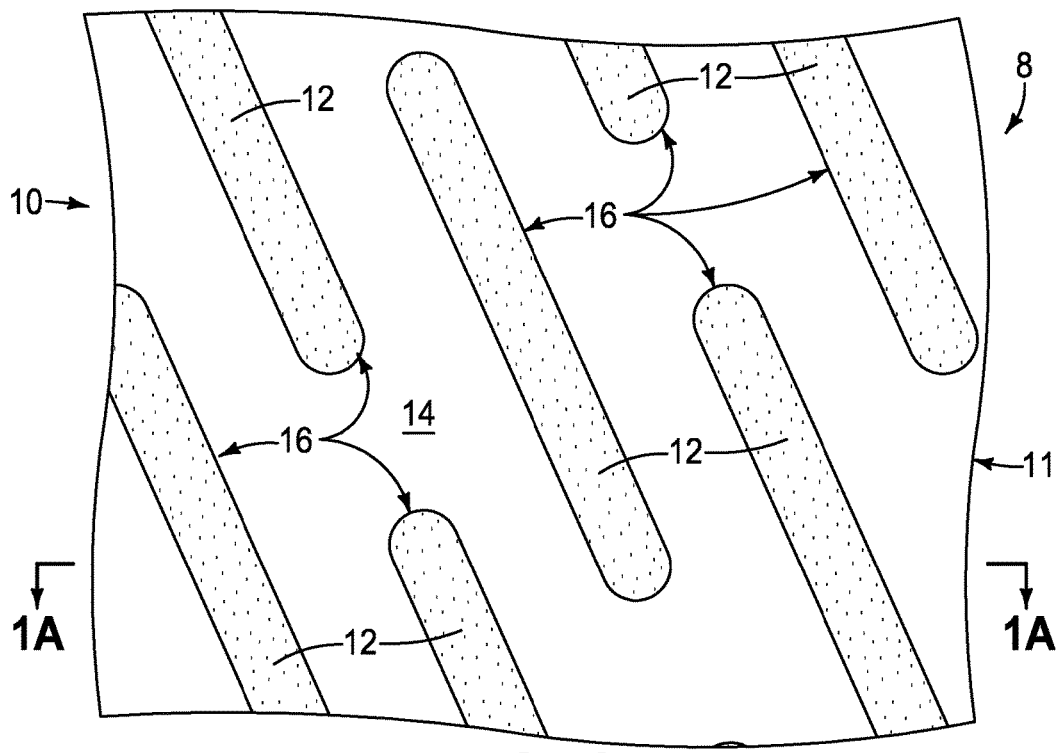
FIG. 1C is a sectional view taken through line 1C-1C in FIG. 1A.
Figure 1D:
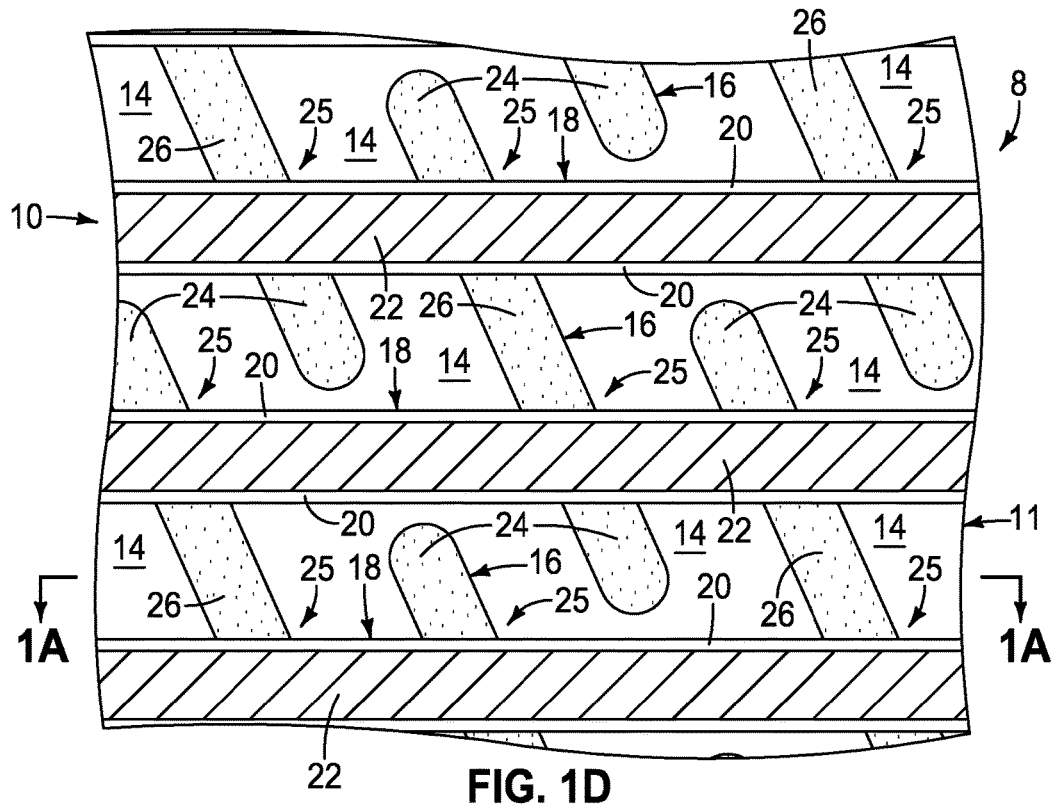
FIG. 1D is a sectional view taken through line 1D-1D in FIG. 1A.
Figure 1E:
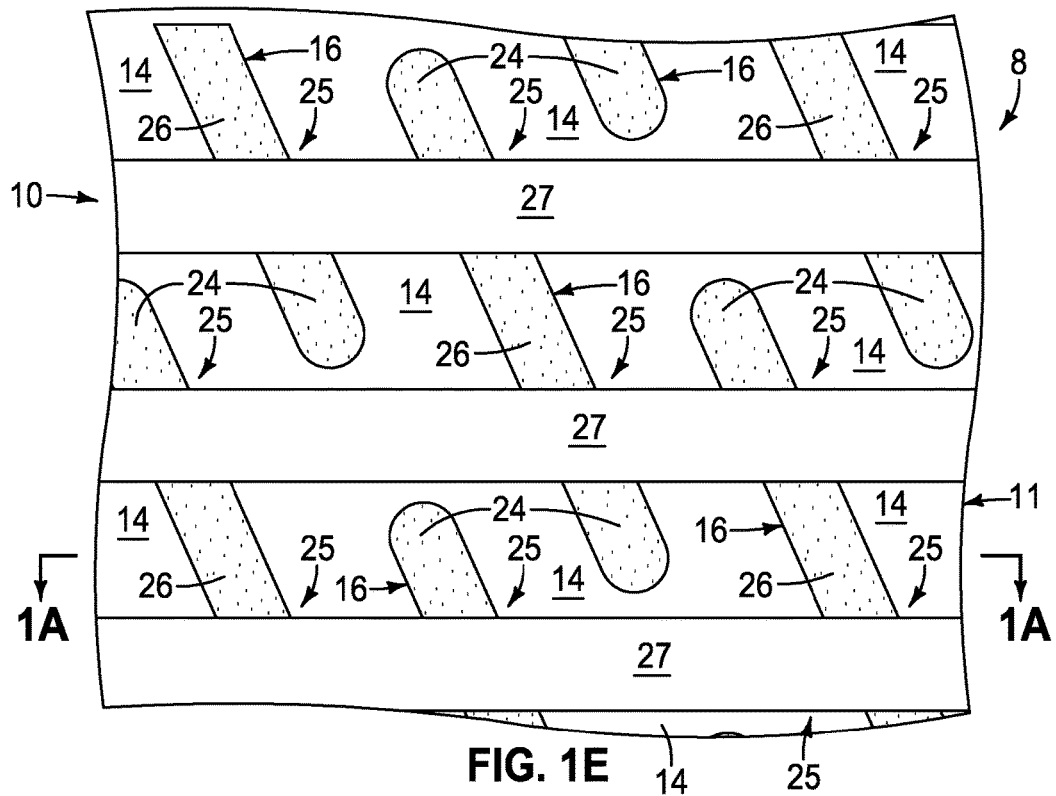
FIG. 1E is a sectional view taken through line 1E-1E in FIG. 1A.
Figure 1F:
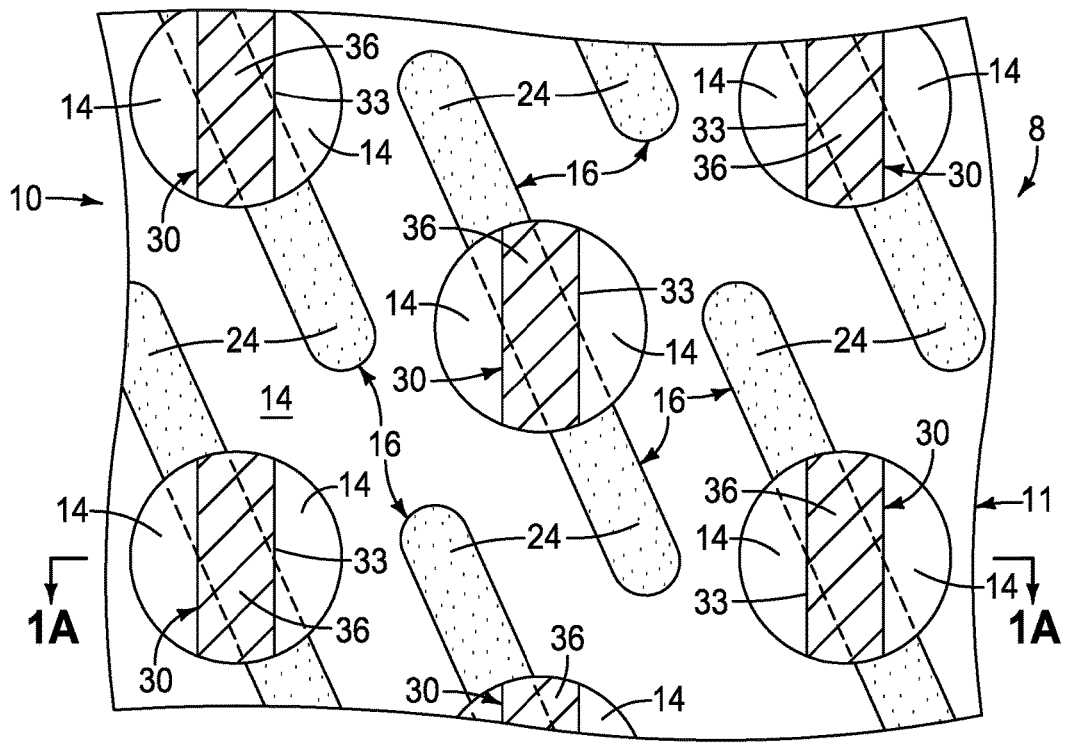
FIG. 1F is a sectional view taken through line 1F-1F in FIG. 1A.
Figure 1G:
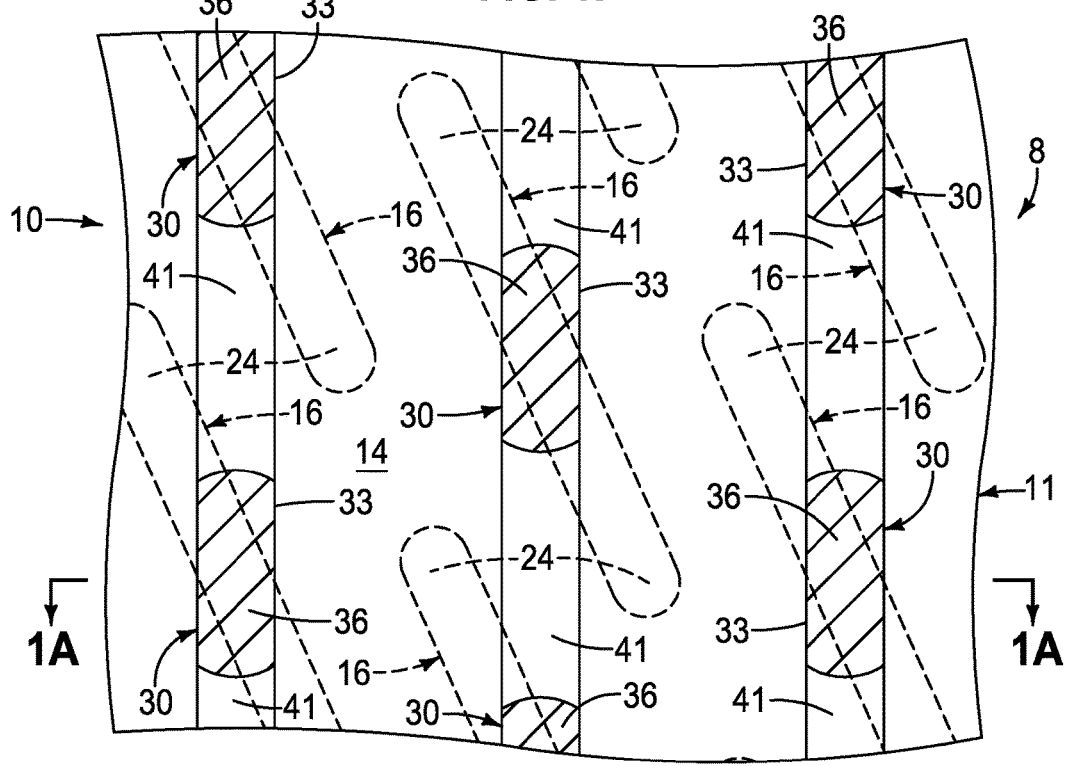
FIG. 1G is a sectional view taken through line 1G-1G in FIG. 1A.
Figure 1H:
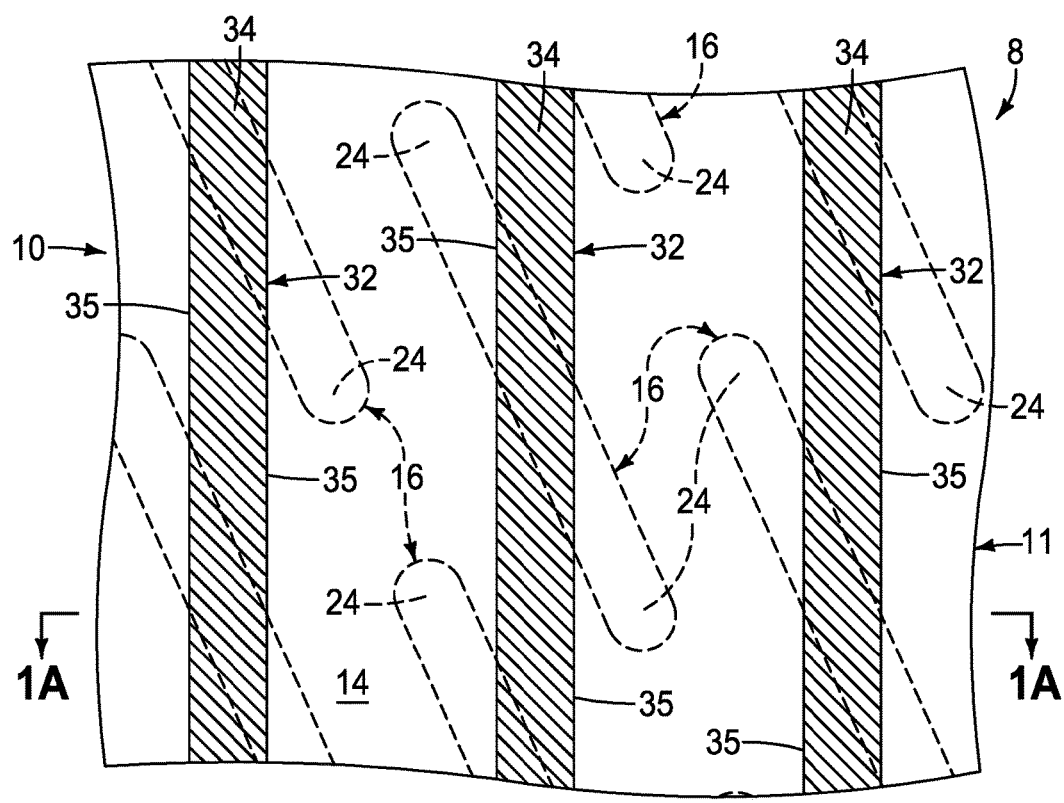
FIG. 1H is a sectional view taken through line 1H-1H in FIG. 1A.
Figure 1J:
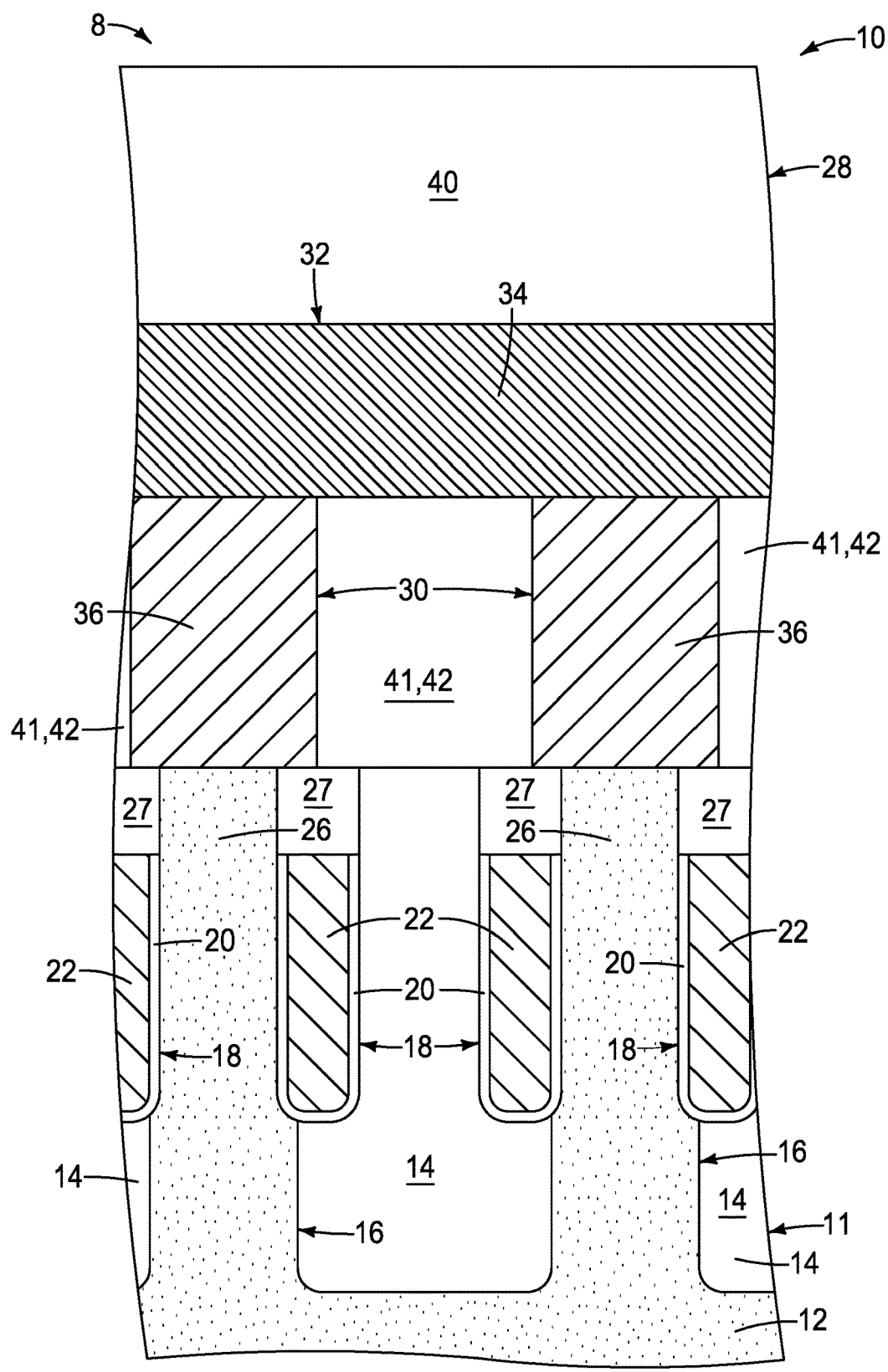
FIG. 1J is a sectional view taken through line 1J-1J in FIG. 1A.

Conductive line 32 and conductive via 30 have opposing sides 35 and 33, respectively, in a vertical cross-section (e.g., the cross-section depicted by FIGS. 1A and 1B). Structures 28 are shown as comprising insulating materials 40, 41, and 42, which may be of the same or different composition relative one another (e.g., silicon nitride and/or doped or undoped silicon dioxide at example individual thicknesses of 50 Angstroms to 600 Angstroms).

Figure 2A:
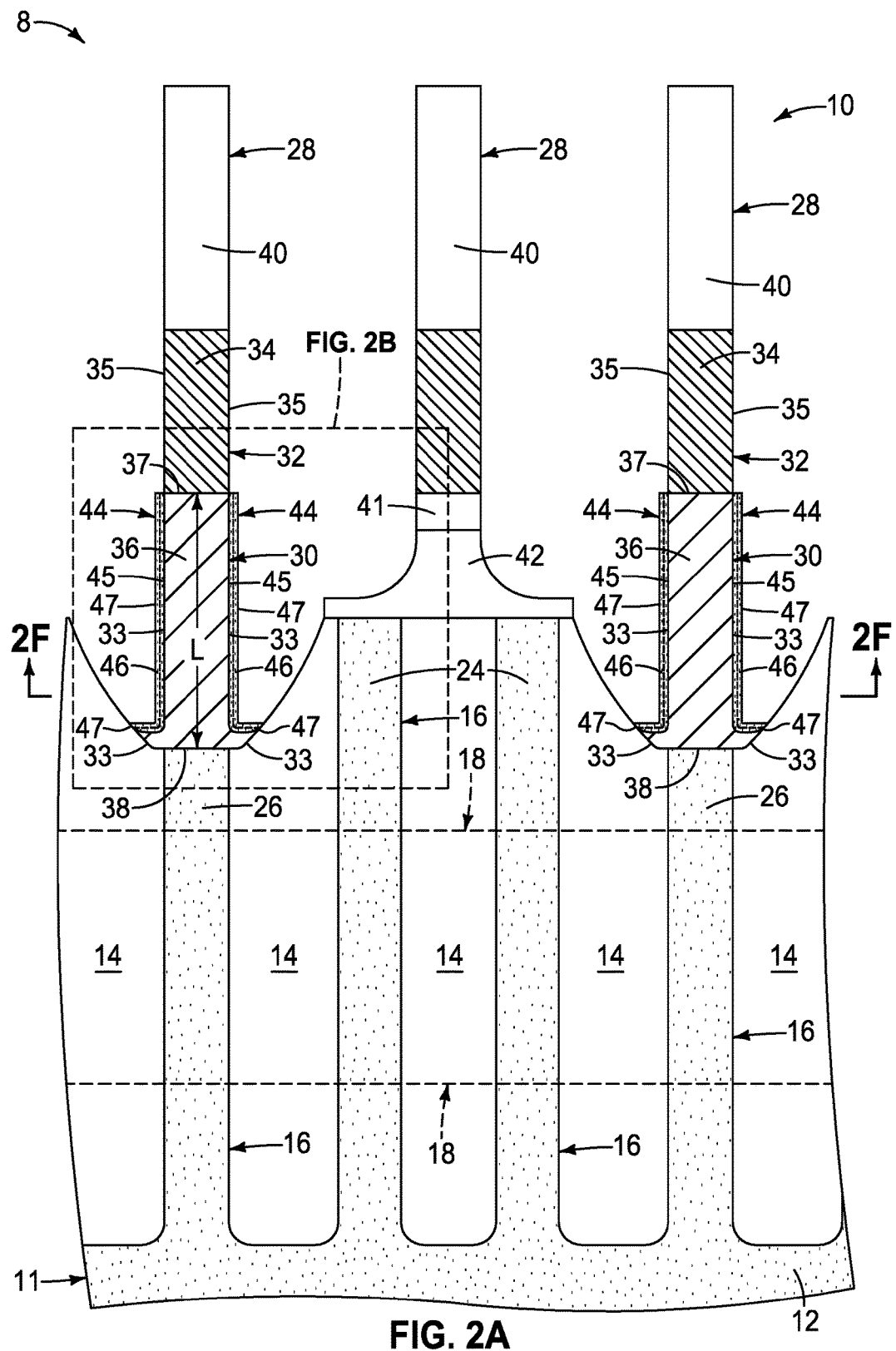
FIG. 2A is a view of the FIG. 1A substrate at a processing step subsequent to that shown by FIG. 1A.
Figure 2B:
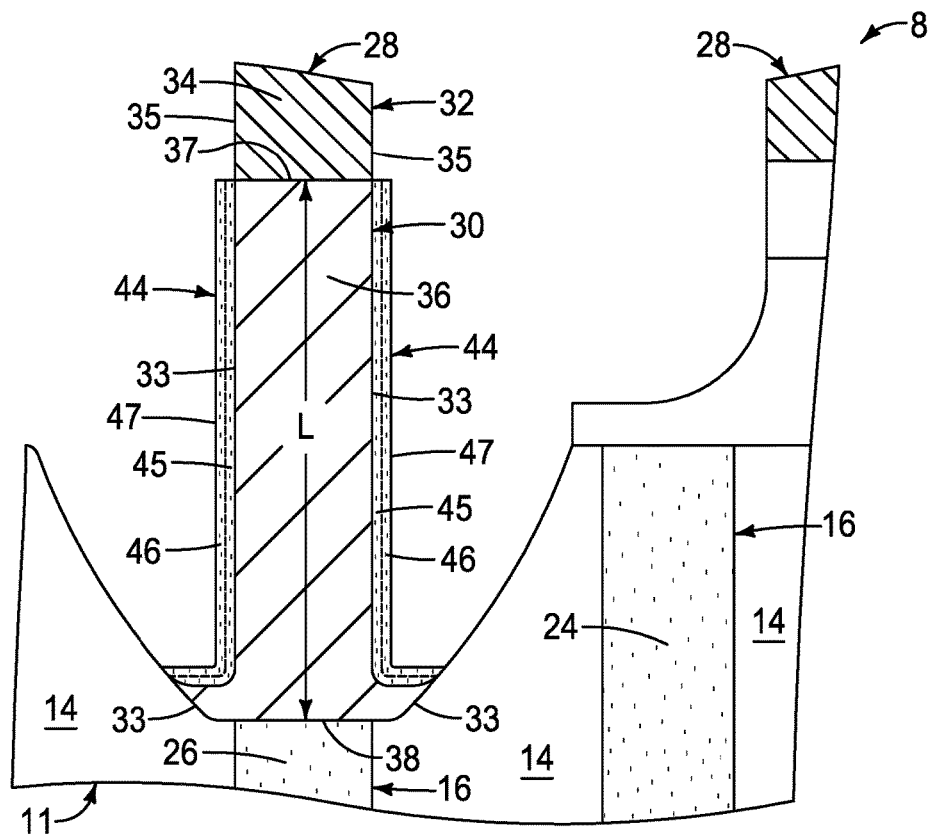
FIG. 2B is an enlarged portion of FIG. 2A.
Figure 2F:
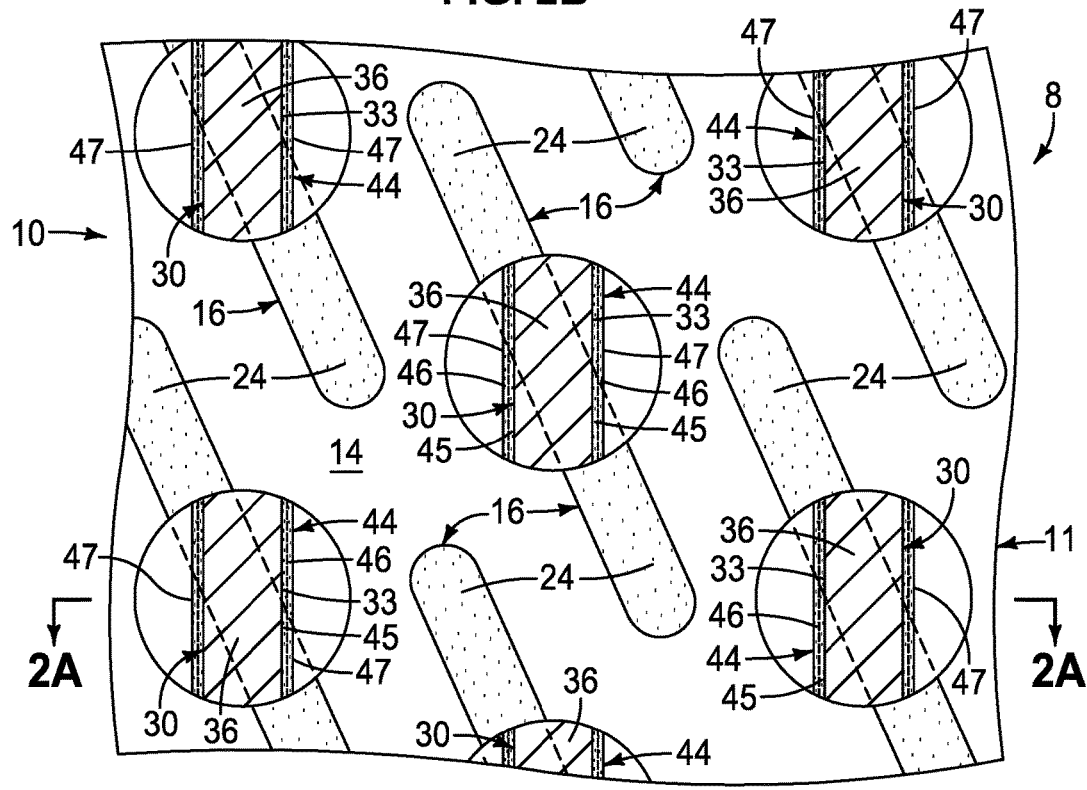
FIG. 2F is a sectional view taken through line 2F-2F in FIG. 2A.

Referring to FIGS. 2A/2B/2F, first insulator material 44 having k (dielectric constant) no greater than 4.0 has been formed laterally outward of opposing sides 33 of second conductive material 36 of conductive via 30 selectively relative to first conductive material 34 of opposing sides 35 of conductive line 32. First insulator material 44 may have k greater than 1. First insulator material 44 is formed to a lateral thickness of at least 40 Angstroms in the vertical cross-section. In one embodiment and as shown, such selectively forming forms no first insulator material 44 laterally outward of opposing sides 35 of first conductive material 34 of conductive line 32. In one embodiment, first insulator material 44 is formed to a lateral thickness of no greater than 100 Angstroms. By way of examples only, example first insulator material 44 comprise silicon oxides (e.g., comprising, consisting essentially of, or consisting of silicon dioxide having k of 3.9 to 4.0), carbon-doped silicon oxides, fluorine-doped silicon oxides, silicon oxycarbides, and carbon-doped silicon nitride. In one embodiment and as shown, first insulator material 44 comprises a composite of two insulative materials 45 and 46. For example and by way of example only, material 45 may comprise a native oxide (e.g., silicon dioxide) that inherently forms to a thickness no greater than 10 Angstroms on sidewalls 33 of a siliconcontaining and/or metal material-containing second material 36, and material 46 may comprise silicon dioxide formed thereover to provide a material 44-lateral thickness of at least 40 Angstroms in the vertical cross-section. Alternately, and by way of example only, insulator material 46 may be of different composition than native oxide and/or other material 45. In such event, determination of k no greater than 4.0 is with respect to k of individual materials 45 and 46, and their respective lateral thicknesses. Accordingly, and by way of example only, one of materials 45 and 46 may have k greater than 4.0 as long as sufficiently thin and/or k of the other material 45 and 46 is sufficiently below 4.0 such that the effective k of first insulator material 44 is no greater than 4.0. Alternately by way of example, each of materials 45 and 46 may have k no greater than 4.0.

In one embodiment, the selectively forming comprises exposing structure 28 to a hydroxide to form first insulator material 44 to comprise an oxide. For example, where first conductive material 34 comprises metal material and second conductive material 36 comprises conductively-doped polysilicon, such act of selectively forming comprises exposing structure 28 to a hydroxide (e.g., liquid and/or vapor fluid comprising an ammonium-hydroxide such as tetra-methyl-ammonium-hydroxide, $H_2O_2$, $O_2$, $O_3$, $H_2O$, etc.) to form silicon dioxide as first insulator material 44. A specific example is aqueous tetra-methyl-ammonium-hydroxide of volumetric concentration relative to water of about 20:1 to 2,000:1 at temperature of 20° C. to 500° C., sub-atmospheric pressure to greater than atmospheric pressure, and for 5 seconds to 10 hours to form first insulator material to comprise silicon dioxide.

First insulator material 44 may be considered as comprising opposing sides 47. Conductive via 30 may be considered as having an elevational length L from top 37 to bottom 38. In one embodiment, first insulator material 44 having lateral thickness of at least 40 Angstroms extends along at least a majority (i.e., more than 50%) of elevational length L of opposing sides 33 of conductive via 30 downwardly from aside top 37 of conductive via 30. In one embodiment and as shown, first insulator material 44 extends along less-than-all of elevational length L of opposing sides 33 of conductive via 30, for example not being along the depicted lowest-most portions of sidewalls 33. In one embodiment and as shown, first insulator material 44 is directly against conductive via 30.

Figure 3A:
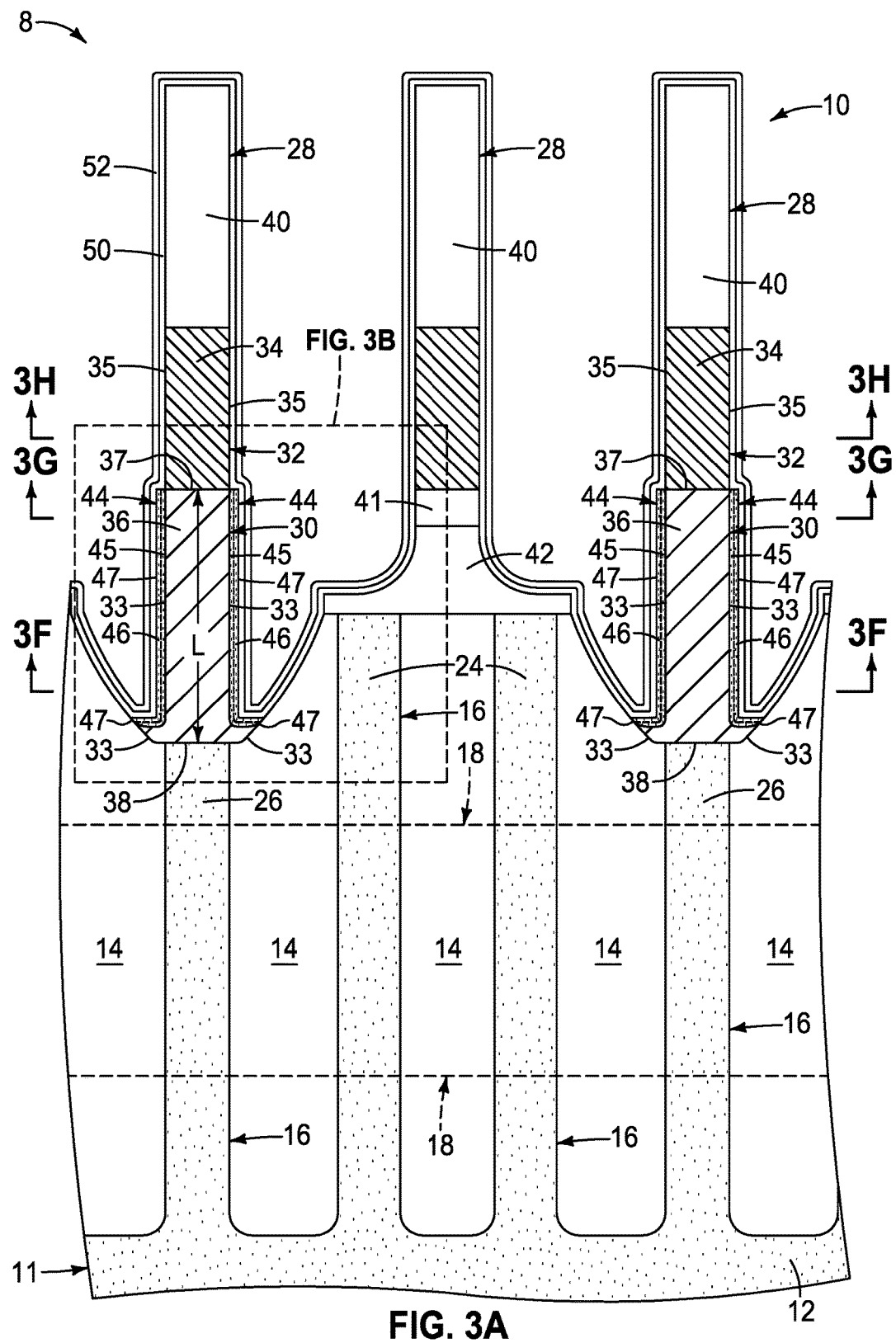
FIG. 3A is a view of the FIG. 2A substrate at a processing step subsequent to that shown by FIG. 2A.
Figure 3B:
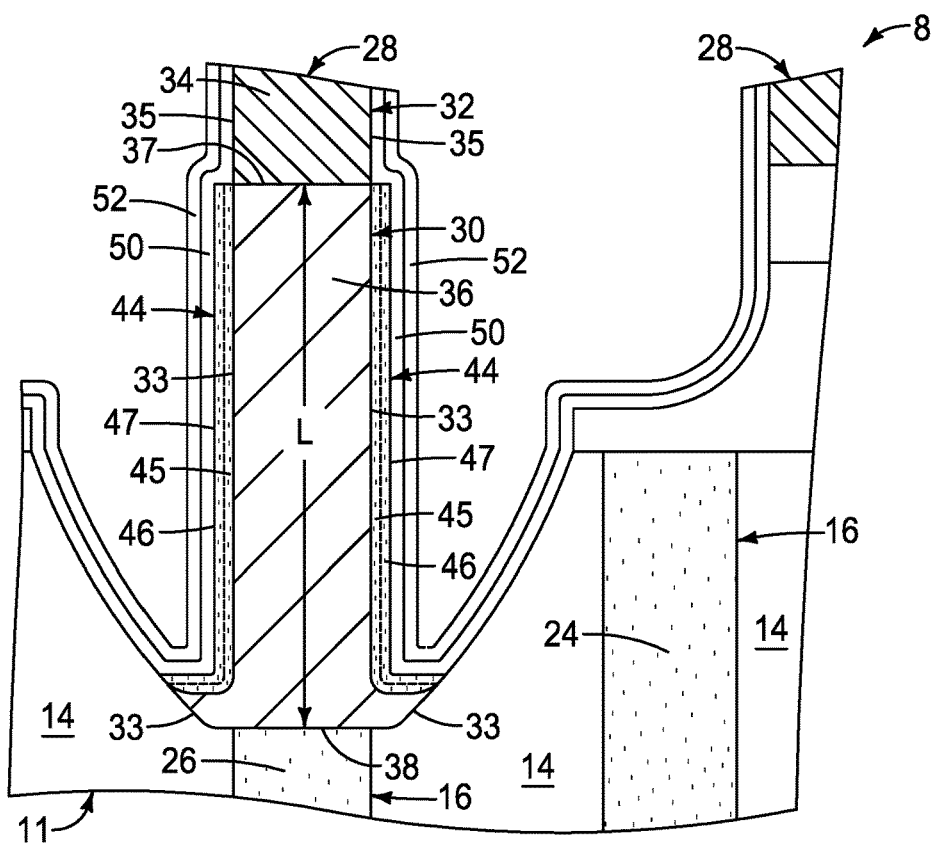
FIG. 3B is an enlarged portion of FIG. 3A.
Figure 3F:
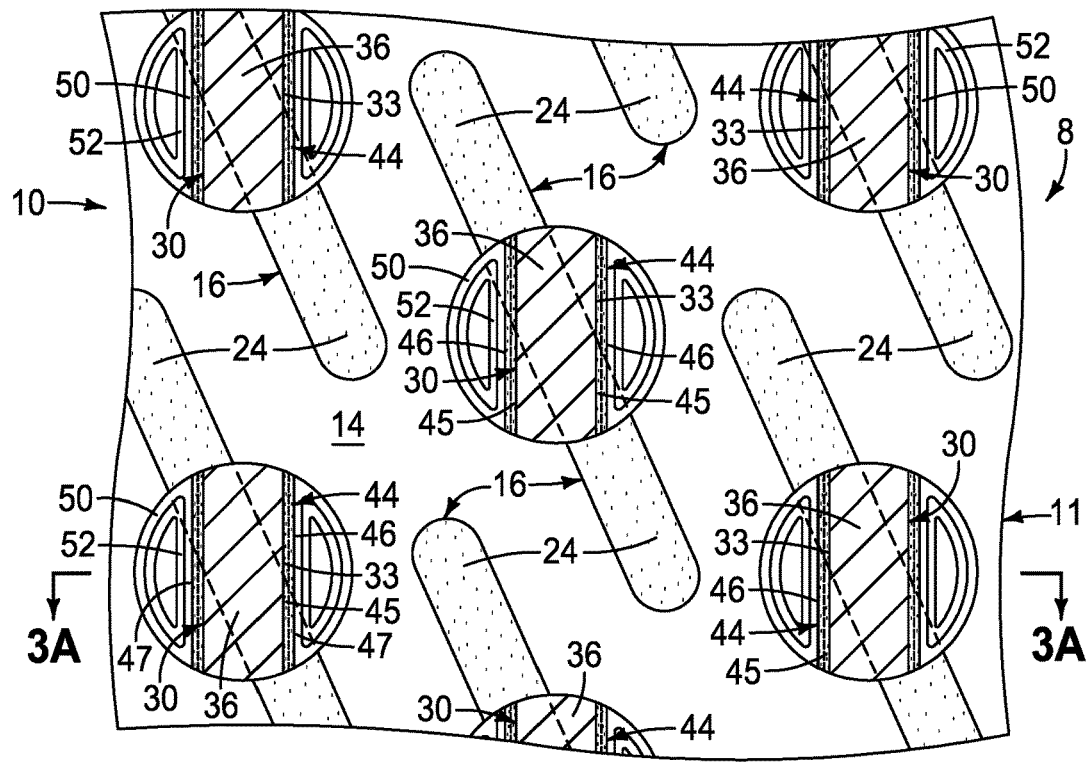
FIG. 3F is a sectional view taken through line 3F-3F in FIG. 3A.
Figure 3G:
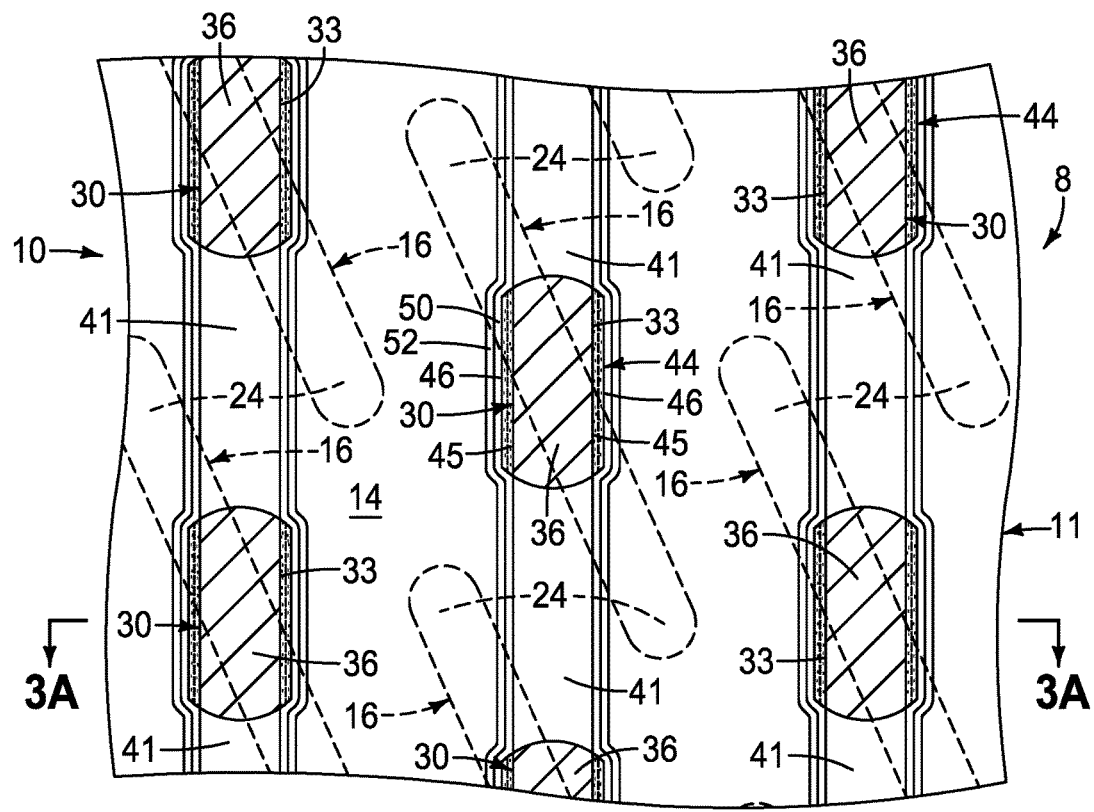
FIG. 3G is a sectional view taken through line 3G-3G in FIG. 3A.
Figure 3H:
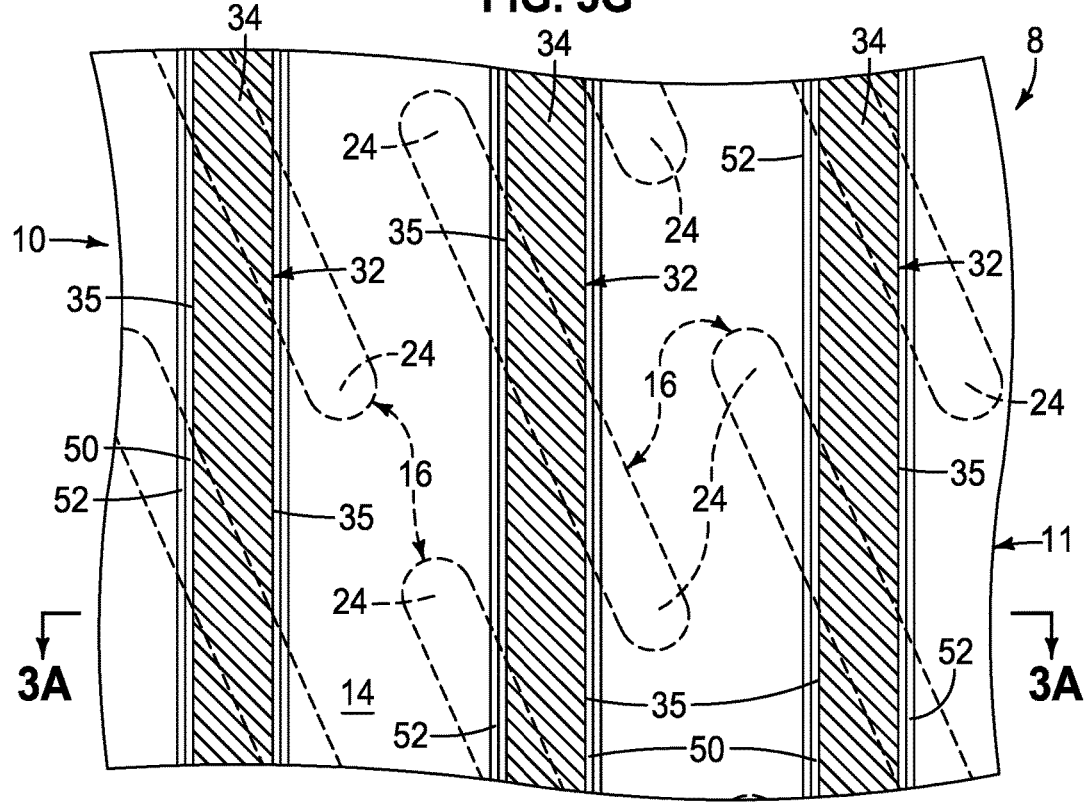
FIG. 3H is a sectional view taken through line 3H-3H in FIG. 3A.

Referring to FIGS. 3A/3B/3F/3G/3H, and in one embodiment, a nitride-containing insulative material 50 (e.g., comprising, consisting essentially of, or consisting of silicon nitride having a thickness of about 20 Angstroms to 50 Angstroms) has been formed laterally outward of opposing sides 47 of first insulator material 44 in the depicted vertical cross-section. In one embodiment, an oxide-containing-insulative material 52 (e.g., comprising, consisting essentially of, or consisting of silicon dioxide of about 10 Angstroms thickness) has been formed laterally outward of opposing sides of nitride-containing-insulative material 50 in the depicted vertical cross-section.

Figure 4A:
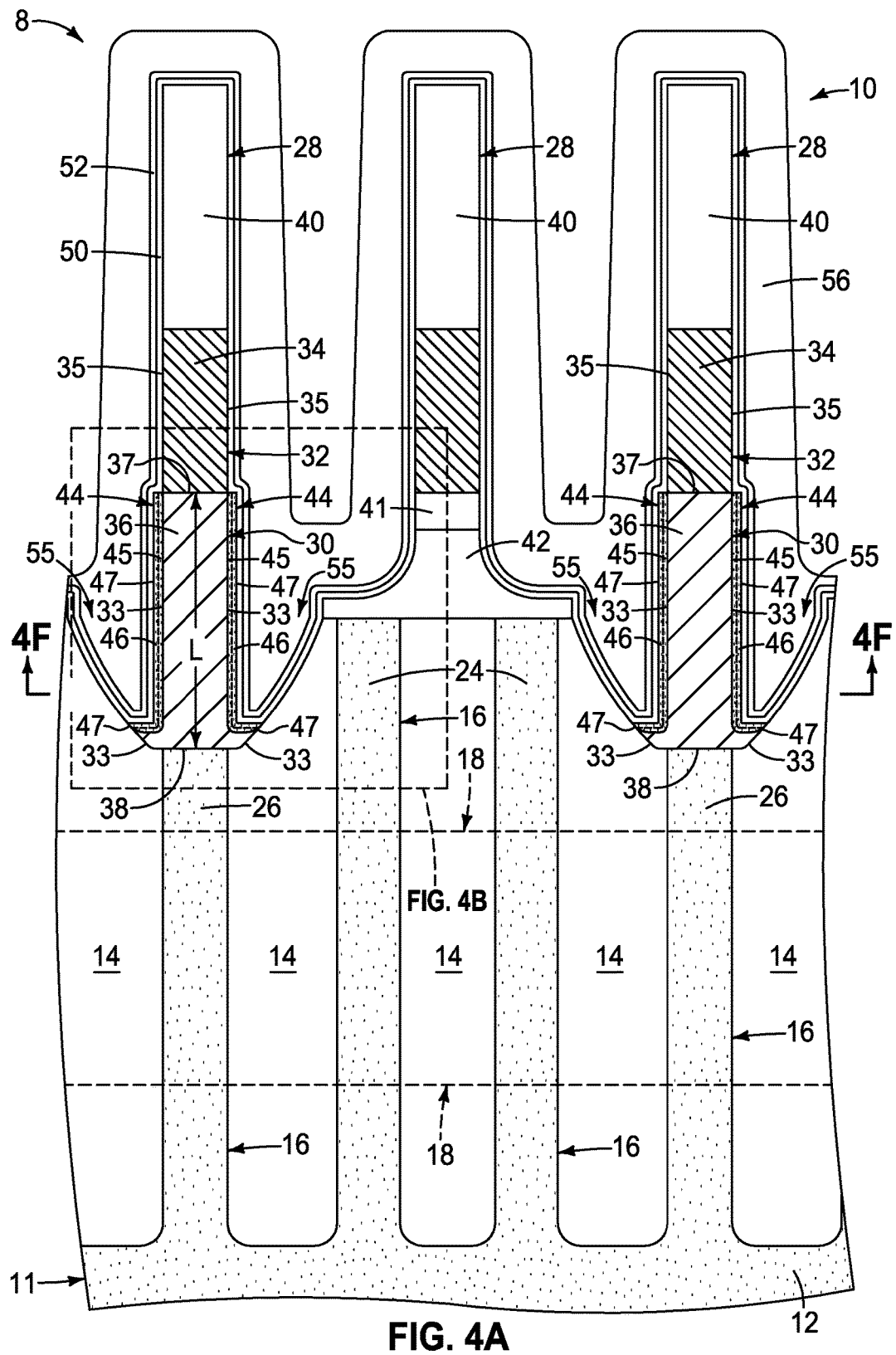
FIG. 4A is a view of the FIG. 3A substrate at a processing step subsequent to that shown by FIG. 3A.
Figure 4B:
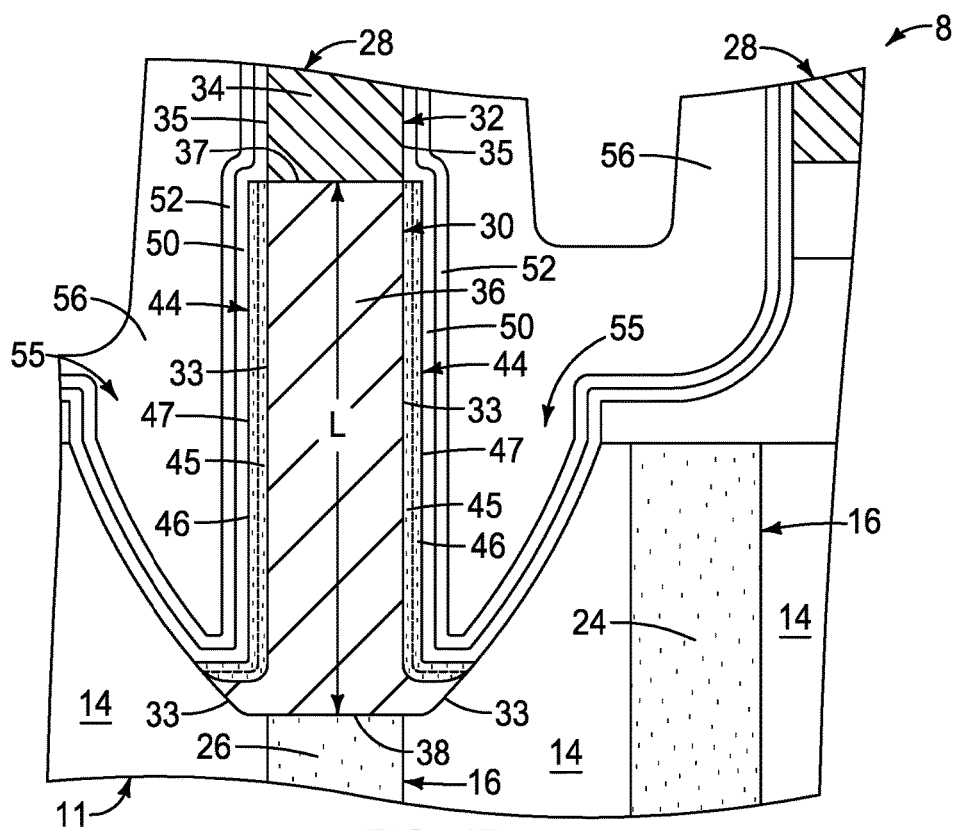
FIG. 4B is an enlarged portion of FIG. 4A.
Figure 4F:
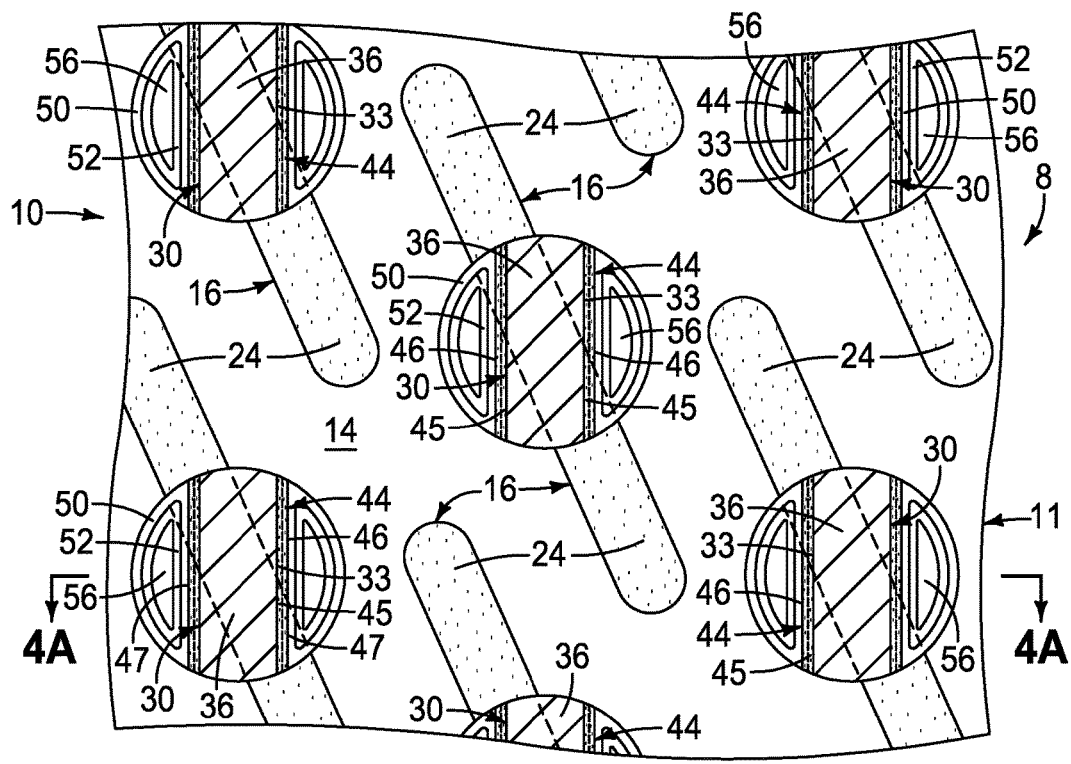
FIG. 4F is a sectional view taken through line 4F-4F in FIG. 4A.

Referring to FIGS. 4A/4B/4F, second insulator material 56 having a k greater than 4.0 is formed laterally outward of opposing sides 47 of first insulator material 44 and, in one embodiment as shown where oxide-containing-insulative material 52 is formed, laterally outward of opposing sides of such oxide-containing-insulative material 52 in the vertical cross-section. In one embodiment, second insulator material 56 is nitride-containing (e.g., comprising, consisting essentially of, or consisting of silicon nitride), for example deposited to a thickness of from 100 to 150 Angstroms sufficient to fill the depicted void space 55 that is on both sides laterally outward of conductive via 30.

In one embodiment, a pair of additional conductive vias is formed laterally outward of the second insulator material in the vertical cross-section. In one such embodiment, the additional vias are formed directly against the second insulator material in the vertical cross-section.

Figure 5A:
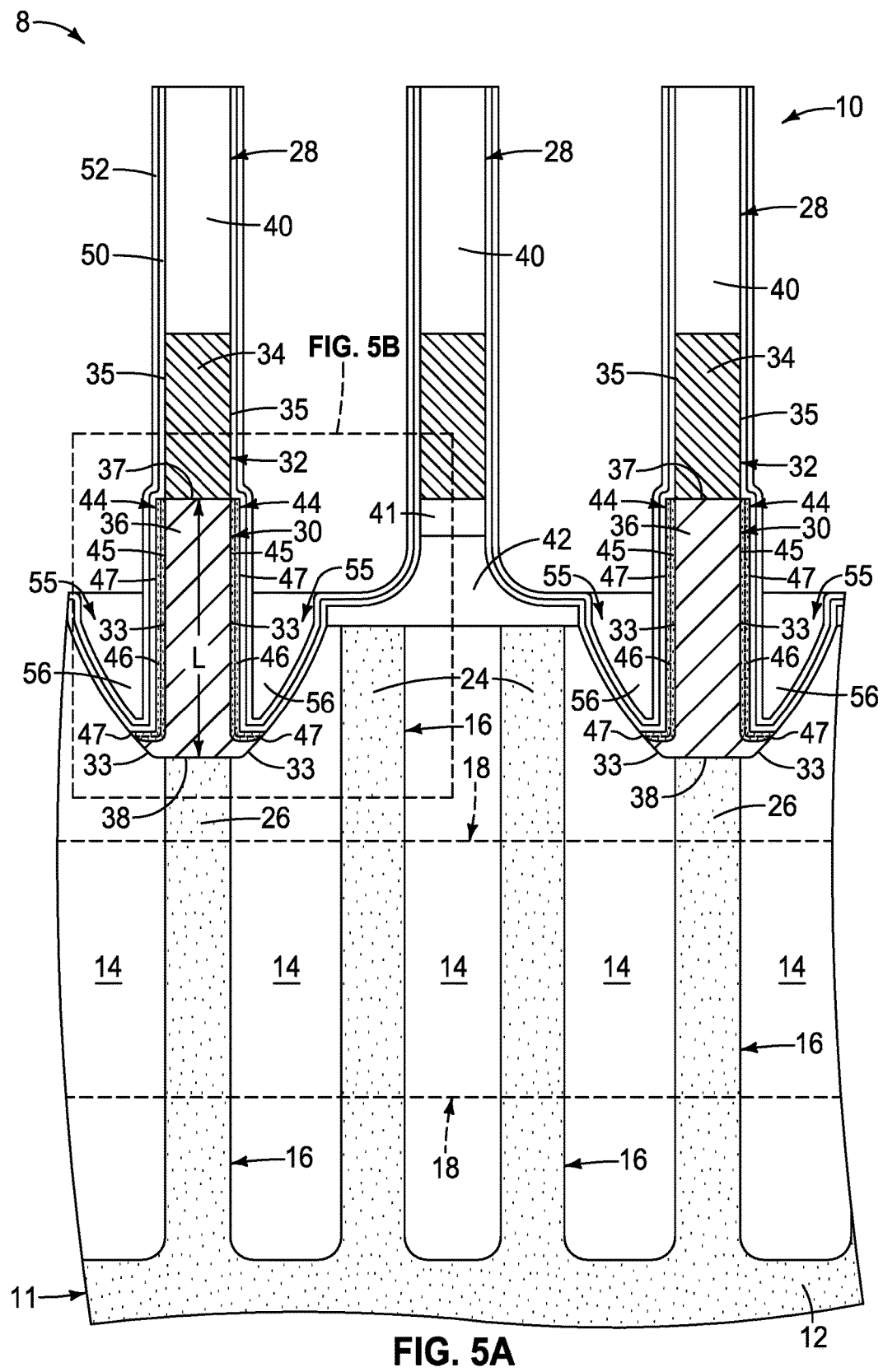
FIG. 5A is a view of the FIG. 4A substrate at a processing step subsequent to that shown by FIG. 4A.
Figure 5B:
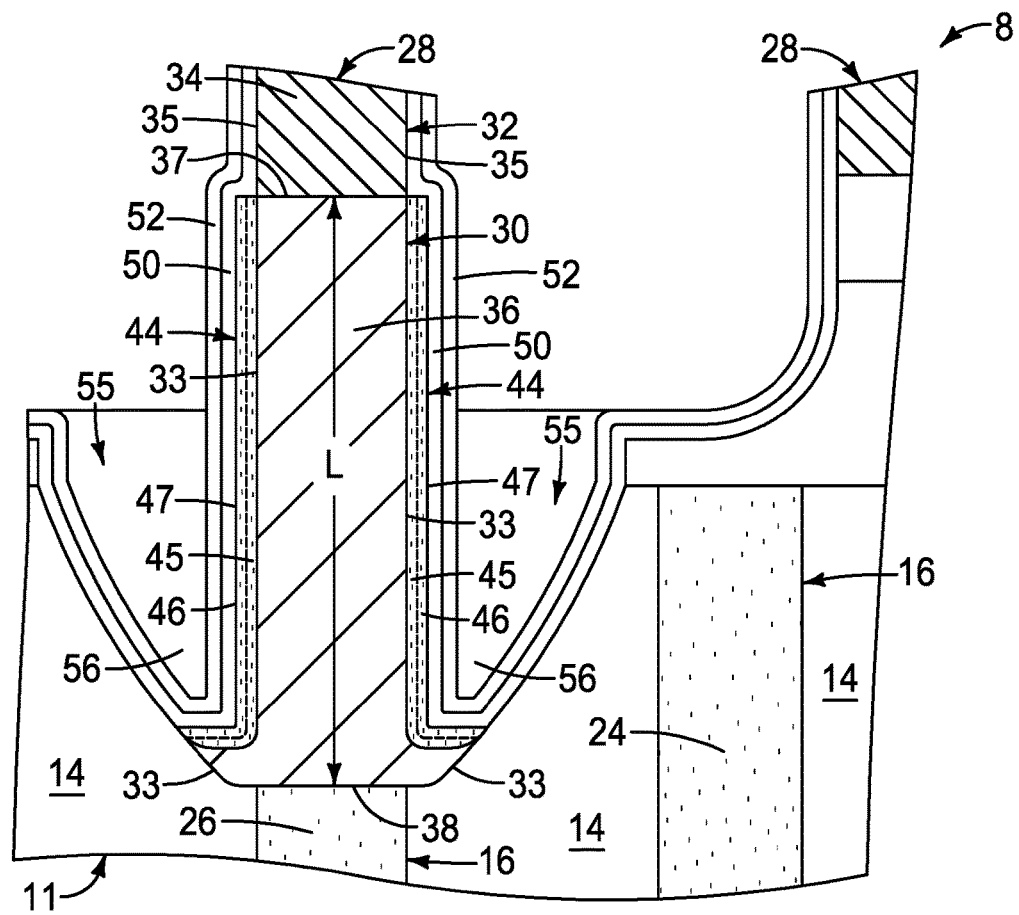
FIG. 5B is an enlarged portion of FIG. 5A.

Referring to FIGS. 5A/5B, second insulator material 56 has been removed back to leave second insulator material 56 filling void spaces 55. An example technique is using a timed wet $H_3PO_4$ chemistry where second insulator material 56 is silicon nitride and insulative material 52 is silicon dioxide.

Figure 6A:
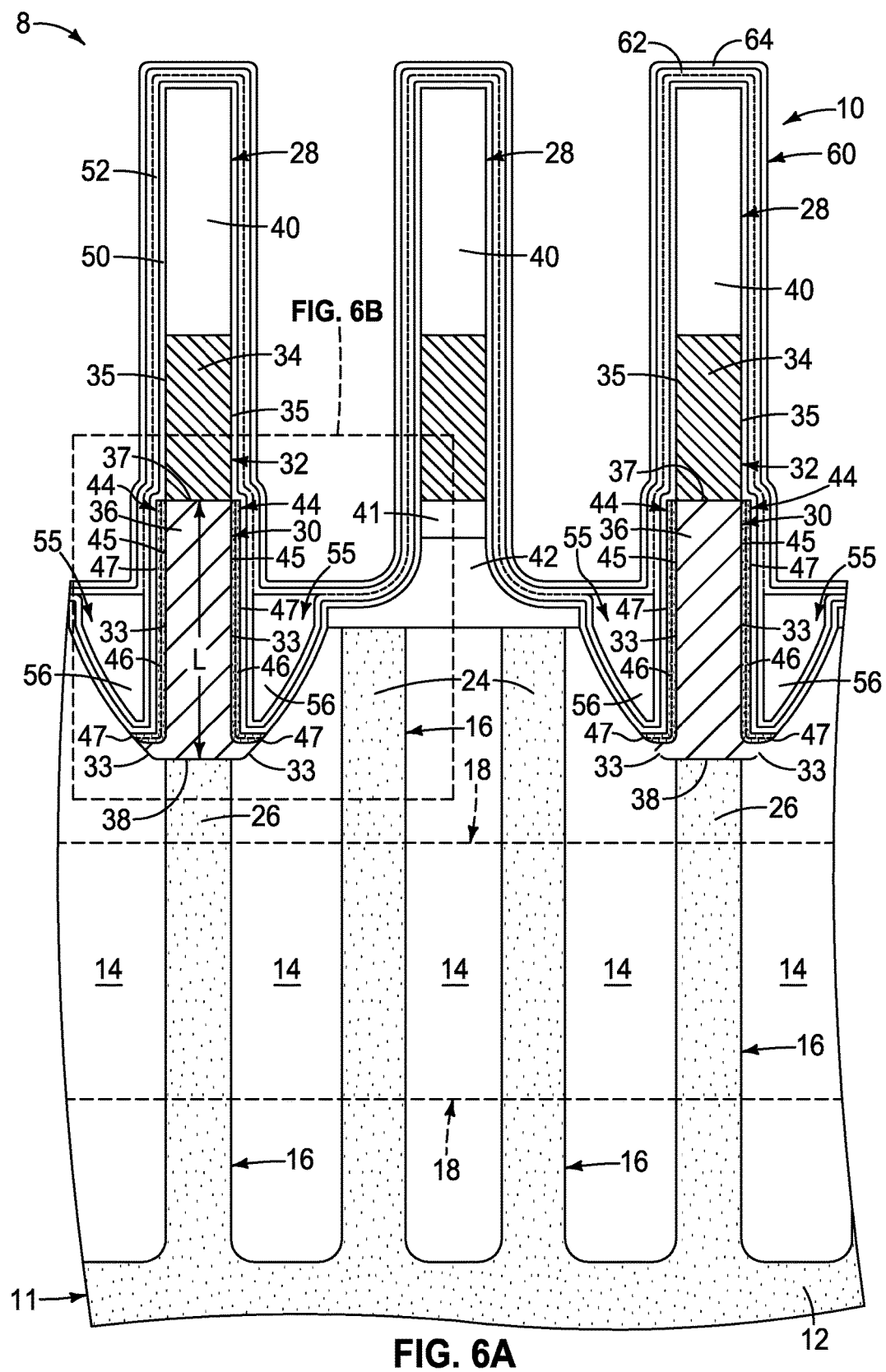
FIG. 6A is a view of the FIG. 5A substrate at a processing step subsequent to that shown by FIG. 5A.
Figure 6B:
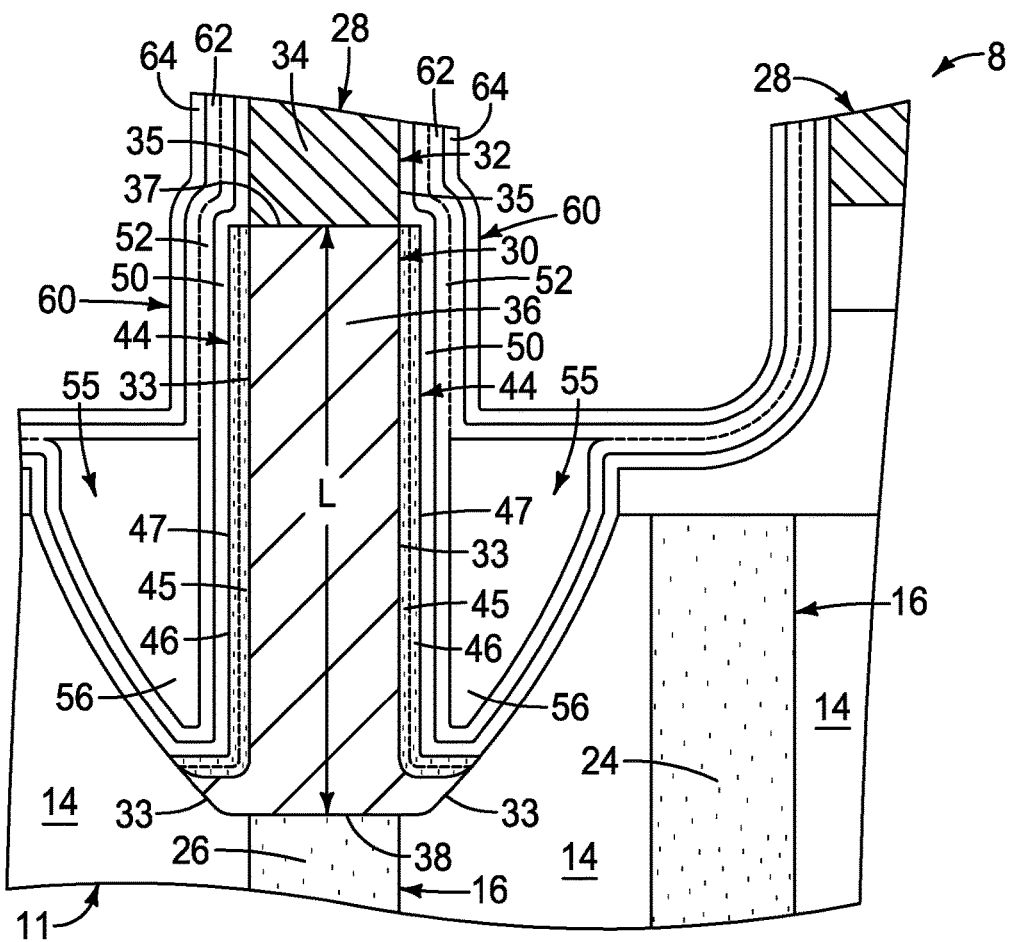
FIG. 6B is an enlarged portion of FIG. 6A.

Referring to FIGS. 6A/6B, and in one embodiment, insulating material 60 has been formed laterally outward of opposing sides of oxide-containing-insulative material 52 in the vertical cross-section above second insulator material 56. In one embodiment, insulating material 60 is formed to comprise an oxide-comprising insulator and in one embodiment is formed to comprise a nitride-comprising insulator. For example, and by way of example only, and where for example insulative material 52 comprises silicon dioxide, insulating material 60 is shown to comprise a silicon dioxide insulating material 62 and a silicon nitride insulator 64 formed laterally outward of oxide-comprising insulator 62. Example thicknesses for each of materials 62 and 64 is 15 Angstroms to 50 Angstroms.

Figure 7A:
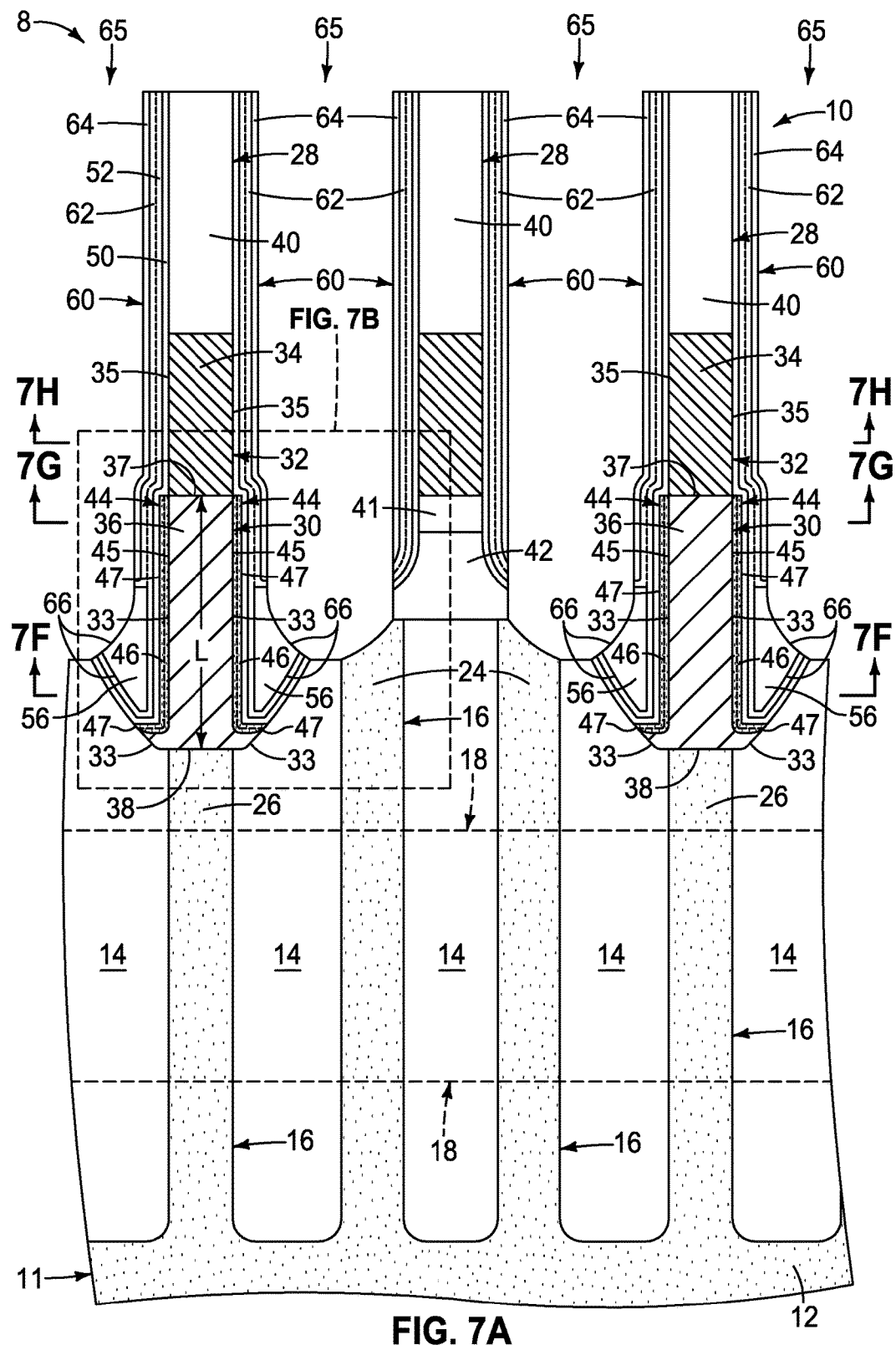
FIG. 7A is a view of the FIG. 6A substrate at a processing step subsequent to that shown by FIG. 6A.
Figure 7B:
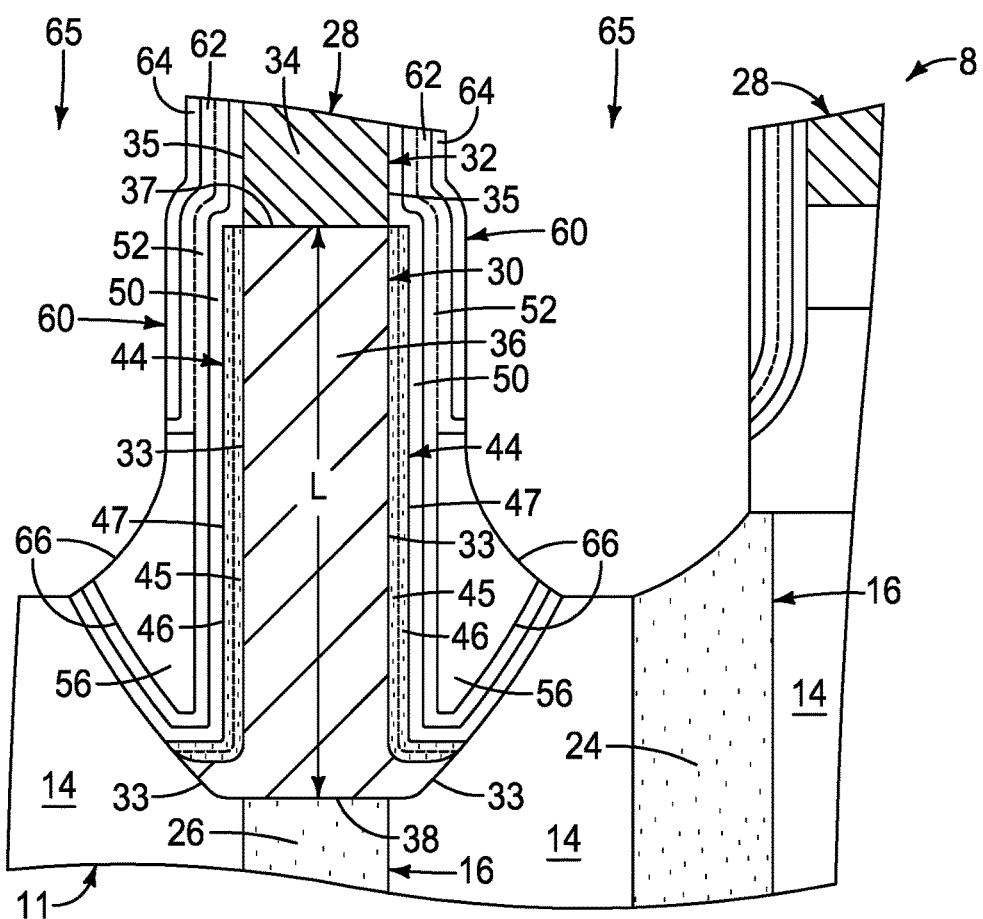
FIG. 7B is an enlarged portion of FIG. 7A.
Figure 7F:
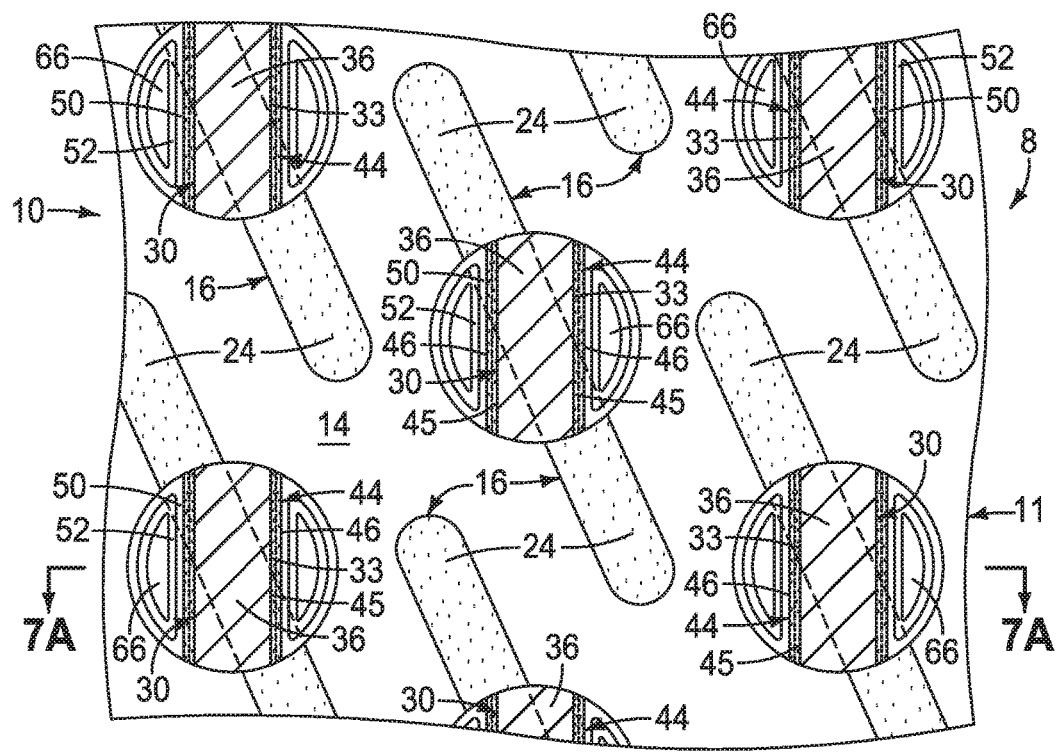
FIG. 7F is a sectional view taken through line 7F-7F in FIG. 7A.
Figure 7G:
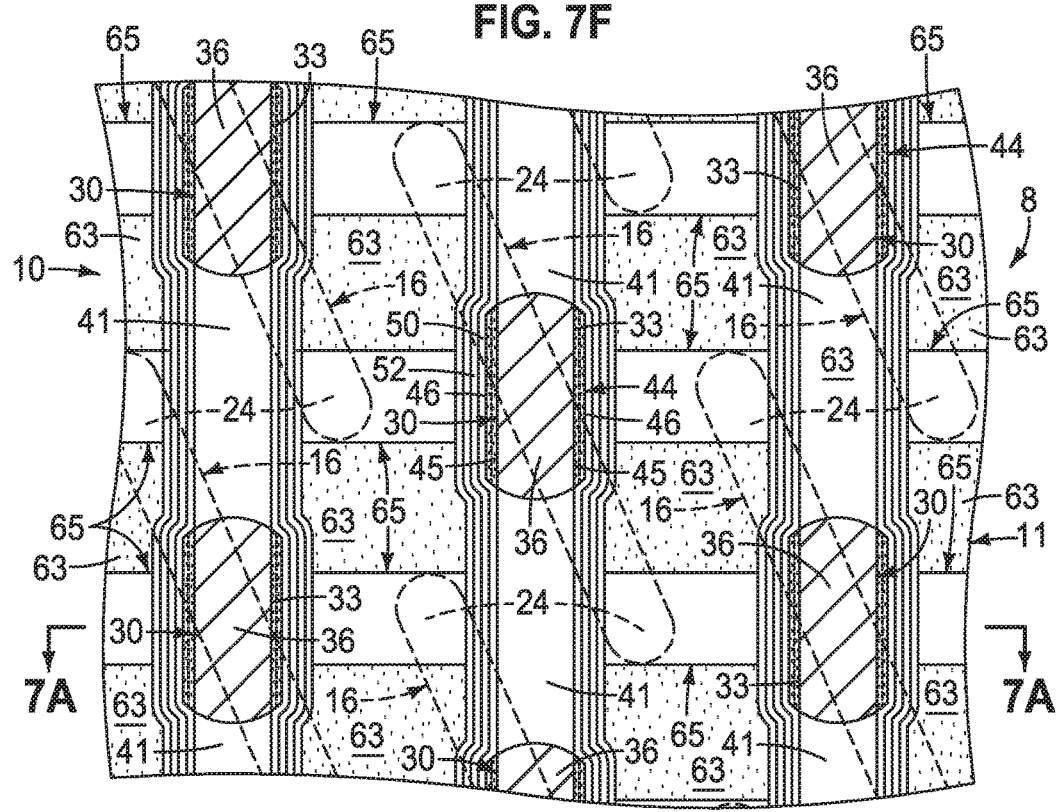
FIG. 7G is a sectional view taken through line 7G-7G in FIG. 7A.
Figure 7H:
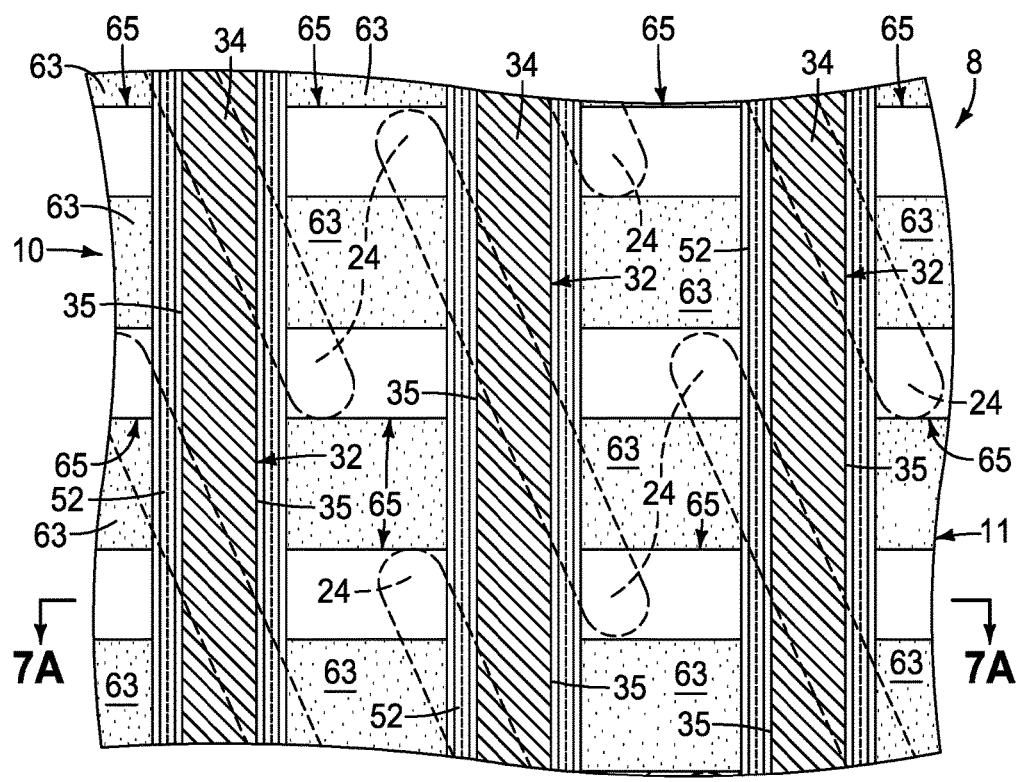
FIG. 7H is a sectional view taken through line 7H-7H in FIG. 7A.

Referring to FIGS. 7A/7B/7F/7G/7H, insulator material 63 material has been deposited and contact openings 65 have been etched there-through as shown to outwardly-expose source/drain regions 24. Such forms second insulator material 56 to have opposing sides 66 in the vertical cross-section.

Figure 8A:
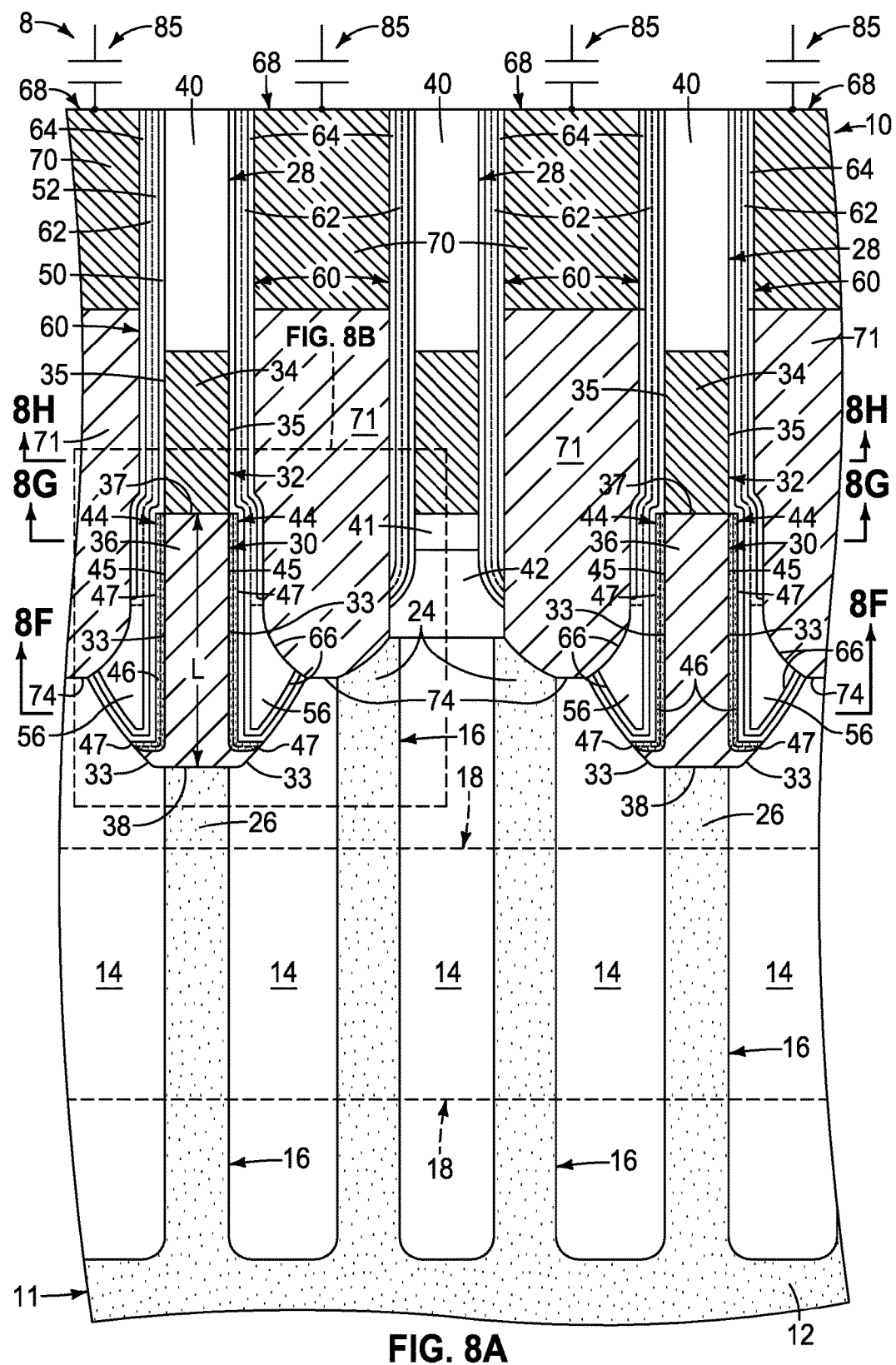
FIG. 8A is a view of the FIG. 7A substrate at a processing step subsequent to that shown by FIG. 7A.
Figure 8B:
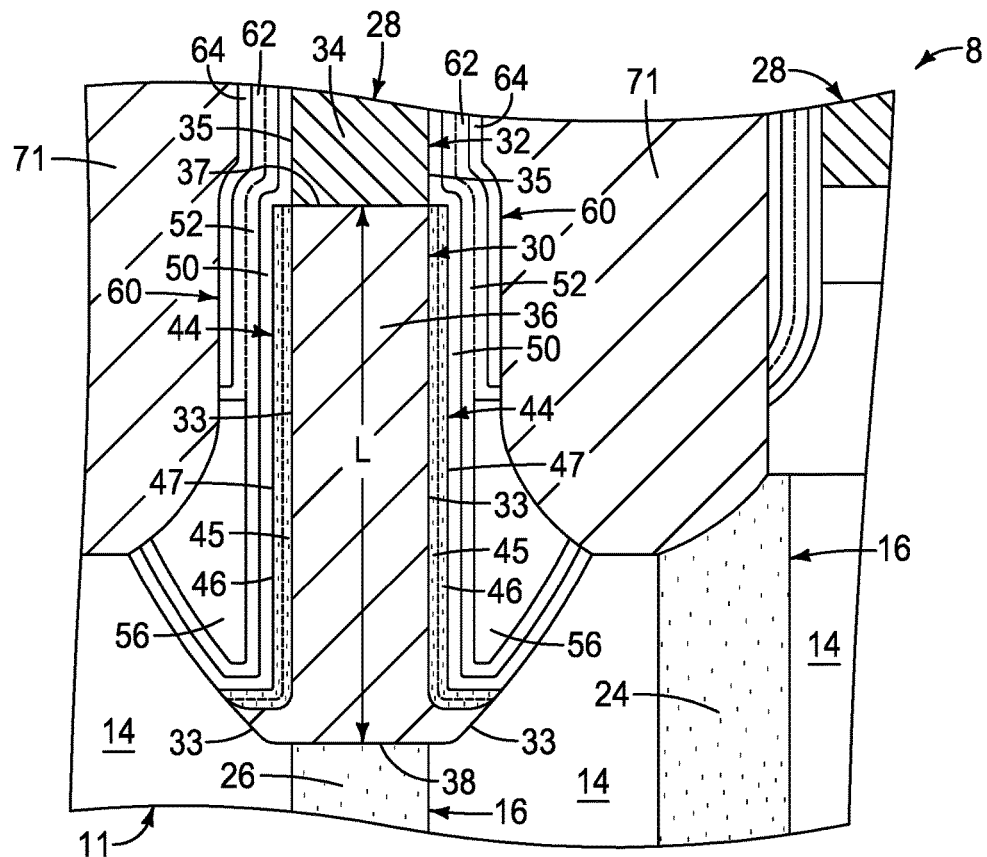
FIG. 8B is an enlarged portion of FIG. 8A.
Figure 8F:
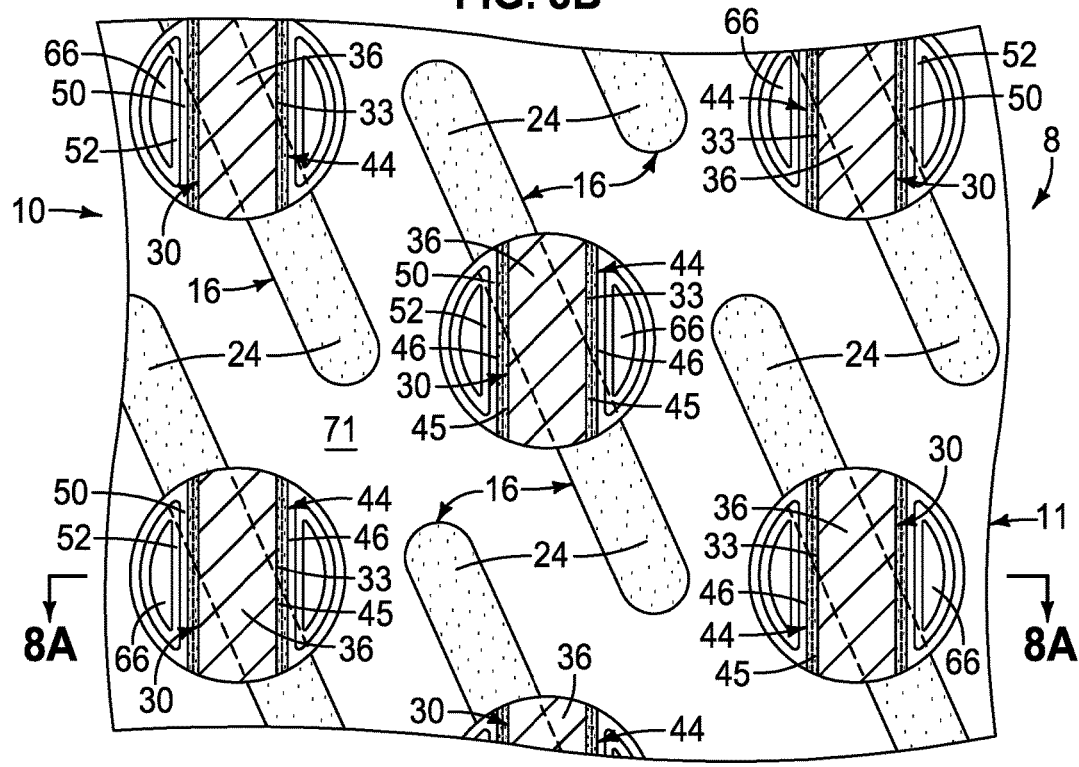
FIG. 8F is a sectional view taken through line 8F-8F in FIG. 8A.
Figure 8G:
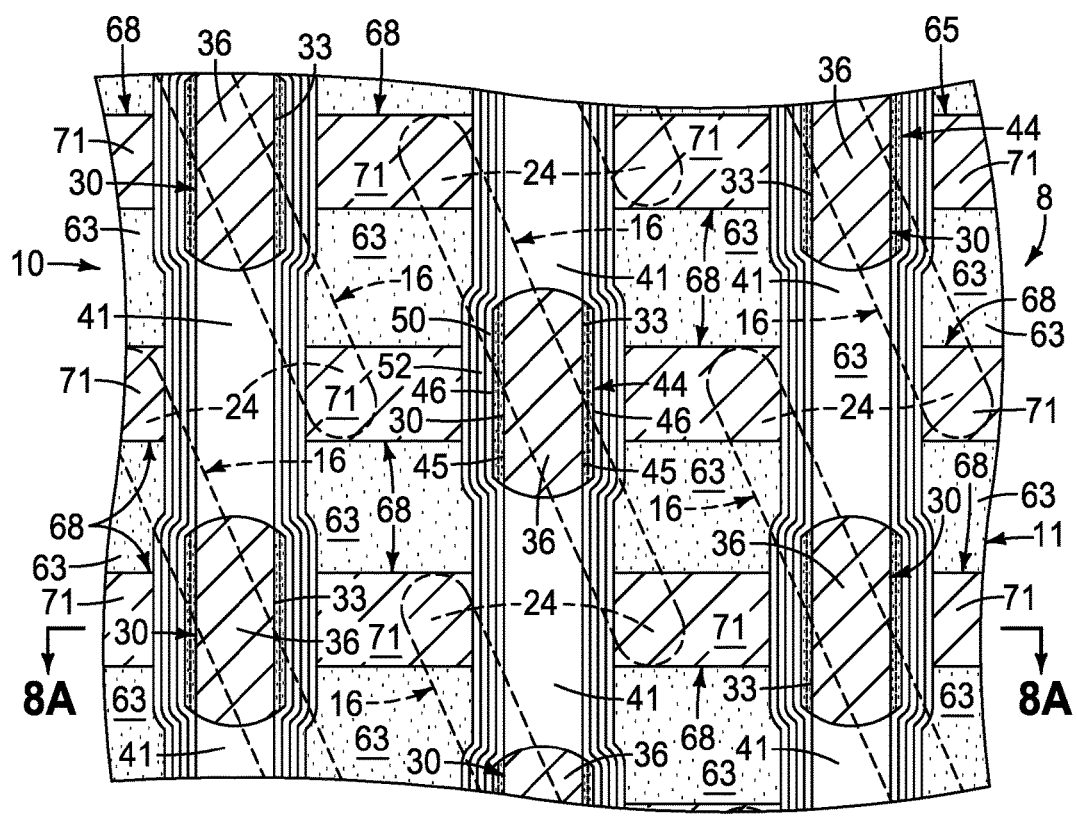
FIG. 8G is a sectional view taken through line 8G-8G in FIG. 8A.
Figure 8H:
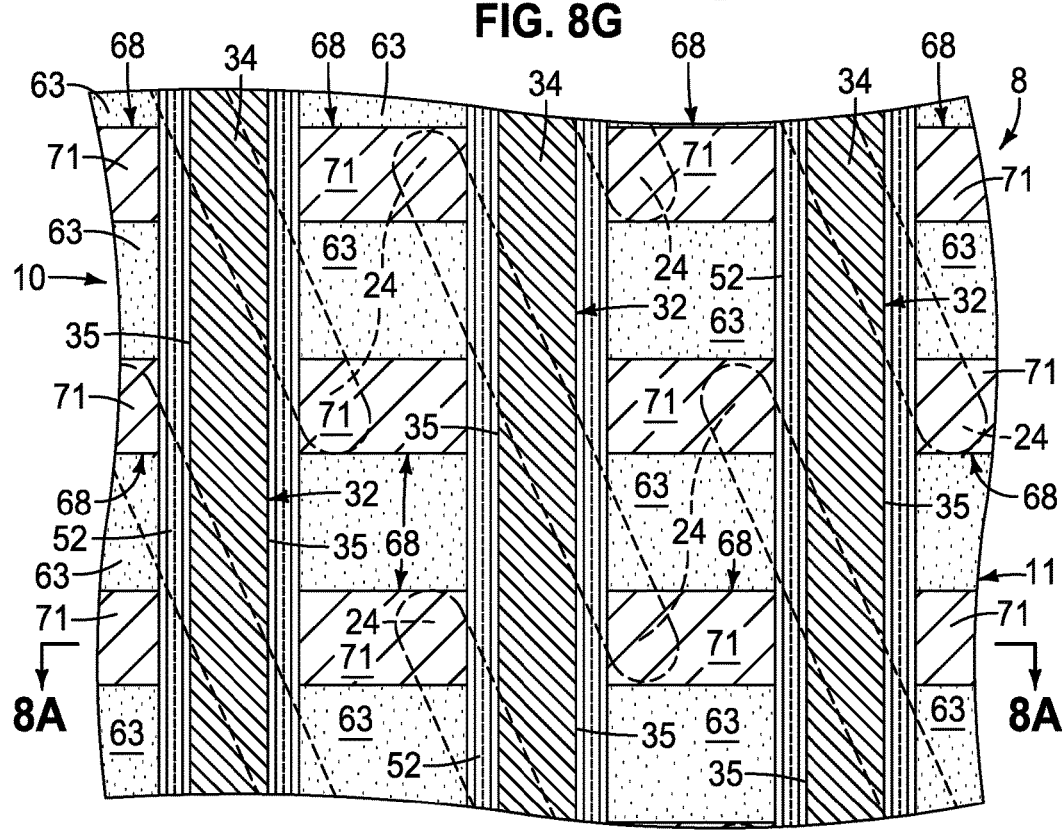
FIG. 8H is a sectional view taken through line 8H-8H in FIG. 8A.

Referring to FIGS. 8A/8B/8F/8G/8H, conductor material 68 has been formed laterally outward of opposing sides 66 of second insulator material 56 in the vertical cross-section (e.g., a pair of conductive vias 68). In one embodiment and as shown, conductor material 68 is shown as comprising two different composition conductive materials 70 and 71 (e.g., 70 being metal material comprising, consisting essentially of, or consisting of any one or more of TiN, W, $WSi_x$, Ru, and Ti, and material 71 comprising, consisting essentially of, or consisting of conductively-doped polysilicon.). In one embodiment and as shown, conductor material 68 on opposing sides of second insulator material 56 has a respective bottom 74 and first insulator material 44 extends lower than bottoms 74 of conductor material 68. In one embodiment and as shown, structure 8 may comprise memory cells individually comprising a field effect transistor 25 (FIGS. 1D/1E) and a capacitor 85 (FIG. 8A).

In one embodiment, structure 8 has parasitic capacitance laterally between conductor material 68 and conductive via 30 of less than 30 attofarads at a voltage delta between conductor material 68 and conductive via 30 of no greater than 1.1 volts. Such parasitic capacitance may be greater than 10 attofarads.

Embodiments of the invention also encompass constructions of integrated circuitry independent of method of manufacture. However, any of the structural attributes described above with respect to method embodiments may be found in structural aspects of the invention and vice versa. In one embodiment, a structure (e.g., 8) of integrated circuitry comprises an elevationally-extending-conductive via (e.g., 30) and a conductive line (e.g., 32) electrically coupled to and crossing above the conductive via. The conductive via has opposing sides (e.g., 33) in a vertical cross-section. First insulator material (e.g., 44) having k no greater than 4.0 is laterally outward of the opposing sides of the conductive via. The first insulator material has a lateral thickness of at least 40 Angstroms along the opposing sides of the conductive via in the vertical cross-section. Second insulator material (e.g., 56) having k greater than 4.0 is laterally outward of opposing sides (e.g., 47) of the first insulator material in the vertical cross-section. Conductor material (e.g., 68) is laterally outward of opposing sides (e.g., 66) of the second insulator material in the vertical cross-section. The conductor material on the opposing sides of the second insulator material has a respective bottom (e.g., 74). The first insulator material having lateral thickness of at least 40 Angstroms and k no greater than 4.0 extends lower than the bottoms of the conductor material on the opposing sides of the second insulator material.

Any other attribute(s) or aspect(s) as shown and/or described herein with respect to other embodiments may be used.

In one embodiment, a structure (e.g., 8) of integrated circuitry comprises an elevationally-extending-conductive via (e.g., 30) and a conductive line (e.g., 32) electrically coupled to and crossing above the conductive via. The conductive via has opposing sides (e.g., 33) in a vertical cross-section. First insulator material (e.g., 44) having k no greater than 4.0 is laterally outward of the opposing sides of the conductive via along at least a majority of elevational-length of the opposing sides of the conductive via downwardly from aside a top (e.g., 37) of the conductive via. The first insulator material has a lateral thickness of at least 40 Angstroms along the opposing sides of the conductive via. Second insulator material (e.g., 56) having k greater than 4.0 is laterally outward of opposing sides (e.g., 47) of the first insulator material in the vertical cross-section. Conductor material (e.g., 68) is laterally outward of opposing sides (e.g., 66) of the second insulator material in the vertical cross-section.

Any other attribute(s) or aspect(s) as shown and/or described herein with respect to other embodiments may be used.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction along a primary substrate surface and may be relative to which the substrate is processed during fabrication, and vertical is a direction generally orthogonal thereto. Further, "vertical" and "horizontal" as used herein are generally perpendicular directions relative one another and independent of orientation of the substrate in three-dimensional space. Additionally, "elevationally-extending" and "extending elevationally" refer to a direction that is angled away by at least 45° from horizontal. Further, "extend(ing) elevationally" and "elevationally-extending" with respect to a field effect transistor are with reference to orientation of the transistor's channel length along which current flows in operation between the source/drain regions. For bipolar junction transistors, "extend(ing) elevationally" and "elevationally-extending" are with reference to orientation of the base length along which current flows in operation between the emitter and collector.

Further, "directly above" requires at least some lateral overlap (i.e., horizontally) of two stated regions/materials/components relative one another. Use of "above" not preceded by "directly" only requires that some portion of the stated region/material/component that is above the other be elevationally outward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Further, unless otherwise stated, each material may be formed using any suitable or yet-to-be-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other, and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Additionally, "metal material" is any one or combination of an elemental metal, a mixture or an alloy of two or more elemental metals, and any conductive metal compound.

In this document, a selective etch or removal is an etch or removal where one material is removed relative to another stated and/or exposed material or materials at a rate of at least 2.0:1. Further, selectively growing or selectively forming is growing or forming one material relative to another stated and/or exposed material or materials at a rate of at least 2.0:1 for at least the first 100 Angstroms of growing or forming.

CONCLUSION

In some embodiments, a method of forming a conductive via comprises forming a structure comprising an elevationally-extending-conductive via and a conductive line electrically coupled to and crossing above the conductive via. The conductive line comprises first conductive material and the conductive via comprises second conductive material of different composition from that of the first conductive material. The conductive line and the conductive via respectively having opposing sides in a vertical cross-section. First insulator material having k no greater than 4.0 is formed laterally outward of the opposing sides of the second conductive material of the conductive via selectively relative to the first conductive material of the opposing sides of the conductive line. The first insulator material is formed to a lateral thickness of at least 40 Angstroms in the vertical cross-section. Second insulator material having k greater than 4.0 is formed laterally outward of opposing sides of the first insulator material in the vertical cross-section.

In some embodiments, a method of forming a conductive via comprises forming a structure comprising an elevationally-extending-conductive via comprising conductively-doped semiconductor material and a conductive line comprising metal material electrically coupled to and crossing above the conductive via. The conductive line and the conductive via respectively have opposing sides in a vertical cross-section. The structure is exposed to an ammonium-hydroxide-containing fluid to form an oxide-containing first insulator material having k no greater than 4.0 laterally outward of the opposing sides of the conductively-doped semiconductor material of the conductive via selectively relative to the metal material of the opposing sides of the conductive line. The first insulator material is formed to a lateral thickness of at least 40 Angstroms in the vertical cross-section. A nitride-containing insulative material is formed laterally outward of opposing sides of the first insulator material in the vertical cross-section. An oxide-containing-insulative material is formed laterally outward of opposing sides of the nitride-containing-insulative material in the vertical cross-section. A nitride-containing second insulator material having k greater than 4.0 is formed laterally outward of opposing sides of the oxide-containing-insulative material in the vertical cross-section. Insulating material is formed laterally outward of opposing sides of the oxide-containing-insulative material in the vertical cross-section above the second insulator material. Conductor material is formed laterally outward of opposing sides of the second insulator material in the vertical cross-section.

In some embodiments, a structure of integrated circuitry comprises an elevationally-extending-conductive via and a conductive line electrically coupled to and crossing above the conductive via. The conductive via has opposing sides in a vertical cross-section. First insulator material having k no greater than 4.0 is laterally outward of the opposing sides of the conductive via. The first insulator material has a lateral thickness of at least 40 Angstroms along the opposing sides of the conductive via in the vertical cross-section. Second insulator material having k greater than 4.0 is laterally outward of opposing sides of the first insulator material in the vertical cross-section. Conductor material is laterally outward of opposing sides of the second insulator material in the vertical cross-section. The conductor material on the opposing sides of the second insulator material has a respective bottom. The first insulator material having lateral thickness of at least 40 Angstroms and k no greater than 4.0 extends lower than the bottoms of the conductor material on the opposing sides of the second insulator material.

In some embodiments, a structure of integrated circuitry comprises an elevationally-extending-conductive via and a conductive line electrically coupled to and crossing above the conductive via. The conductive via has opposing sides in a vertical cross-section. First insulator material having k no greater than 4.0 is laterally outward of the opposing sides of the conductive via along at least a majority of elevational-length of the opposing sides of the conductive via downwardly from aside a top of the conductive via. The first insulator material has a lateral thickness of at least 40 Angstroms along the opposing sides of the conductive via. Second insulator material having k greater than 4.0 is laterally outward of opposing sides of the first insulator material in the vertical cross-section. Conductor material is laterally outward of opposing sides of the second insulator material in the vertical cross-section.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A structure of integrated circuitry, comprising:
   a transistor comprising a pair of source/drain regions, a buried gate, and a channel region along the buried gate between the pair of source/drain regions;
   a first conductive via electrically coupled to and projecting from one of the pair of source/drain regions, the first conductive via having a first sidewall;
   a second conductive via electrically coupled to and projecting from the other of the pair of source/drain regions, the second conductive via having a second sidewall; and
   an insulative layer between the first sidewall of the first conductive via and the second sidewall of the second conductive via, the insulative layer comprising:
   first insulator material;
   second insulator material;
   third insulator material between the first and second insulator materials; and
   each of the first and second insulator materials having greater k than the third insulator material.

2. The structure of claim 1 wherein,
   each of the first and second insulator materials has k greater than 4.0; and
   the third insulator material has k no greater than 4.0.

3. The structure of claim 1 further comprising a conductive line electrically coupled to and crossing above the first conductive via.

4. The structure of claim 3 wherein the conductive line has a third sidewall, the insulative layer extending to cover the third sidewall of the conductive line.

5. The structure of claim 4 wherein the conductive line comprises a metal and the first conductive via comprises polycrystalline semiconductor material.

6. The structure of claim 3 further comprising a capacitive element electrically coupled to the second conductive via.

7. The structure of claim 1 wherein the insulative layer further comprises a fourth insulator material between the first and third insulator materials, each of the first and second insulator materials having greater k than the fourth insulator material.

8. The structure of claim 7 wherein,
   each of the first and second insulator materials has k greater than 4.0; and each of the third and fourth insulator materials has K no greater than 4.0.

9. A structure of integrated circuitry, comprising:
a first semiconductor region having a first upper surface;
a second semiconductor region having a second upper surface that is higher than the first upper surface of the first semiconductor region;
a first conductive via electrically coupled to and projecting from the first semiconductor region, the first conductive via having a first sidewall;
a second conductive via electrically coupled to and projecting from the second semiconductor region, the second conductive via having a second sidewall; and
an isolation structure between the first and second conductive vias separating the first and second conductive vias from each other, the isolation structure comprising:
first insulator material surrounding the first conductive via; and
second insulator material intervening between the first insulator material and the second conductive via, the second insulator material comprising:
third insulator material;
fourth insulator material;
fifth insulator material between the third and fourth insulator materials; and
each of the third and fourth insulator materials having greater k than the fifth insulator material.

10. The structure of claim 9 wherein each of the third and fourth insulator materials has greater k than the first insulator material.

11. The structure of claim 10 wherein,
each of the third and fourth insulator materials has k greater than 4.0; and
each of the first and fifth insulator materials has k no greater than 4.0.

12. The structure of claim 9 wherein each of the first and second conductive vias comprises a polycrystalline semiconductor material.

13. The structure of claim 12 wherein the polycrystalline semiconductor material comprises polysilicon.

14. The structure of claim 9 further comprising a conductive line electrically coupled to and crossing above the first conductive via.

15. The structure of claim 14 wherein,
the first insulator material terminates substantially at the first upper surface of the first conductive via; and
the second insulator material extends to cover a sidewall of the conductive line.

16. The structure of claim 15 wherein,
the conductive line has a third upper surface; and
the second supper surface of the second conductive via is between the first upper surface of the first conductive via and the third upper surface of the conductive line.

17. The structure of claim 14 wherein the conductive line is different in material from each of the first and second conductive vias.

18. The structure of claim 9 wherein,
the second insulator material further comprises sixth insulator material between the third and fifth insulator materials; and
each of the third and fourth insulator materials having greater k than each of the fifth and sixth insulator materials.

19. The structure of claim 18 wherein,
each of the third and fourth insulator materials has K greater than 4.0; and
each of the fifth and sixth insulator materials has K no greater than 4.0.

20. The structure of claim 19 wherein the first insulator material has k no greater than 4.0.

* * * * *

UNITED STATES PATENT AND TRADEMARK OFFICE
CERTIFICATE OF CORRECTION

PATENT NO. : 10,128,183 B1
APPLICATION NO. : 15/926505
DATED : November 13, 2018
INVENTOR(S) : Dhir et al.

Page 1 of 1

It is certified that error appears in the above-identified patent and that said Letters Patent is hereby corrected as shown below:

In the Claims

Column 12, Line 16 – Replace "second supper" with --second upper--

Signed and Sealed this
Nineteenth Day of February, 2019

Andrei Iancu
*Director of the United States Patent and Trademark Office*